(12) United States Patent
Kondo

(10) Patent No.: US 11,537,044 B2
(45) Date of Patent: Dec. 27, 2022

(54) IMPRINT APPARATUS AND ARTICLE MANUFACTURING METHOD

(71) Applicant: CANON KABUSHIKI KAISHA, Tokyo (JP)

(72) Inventor: Yousuke Kondo, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/775,547

(22) Filed: Jan. 29, 2020

(65) Prior Publication Data

US 2020/0257193 A1 Aug. 13, 2020

(30) Foreign Application Priority Data

Feb. 8, 2019 (JP) .............................. JP2019-021824

(51) Int. Cl.
*G03F 7/00* (2006.01)
*B29C 33/42* (2006.01)
*G05B 15/00* (2006.01)
*B29C 43/02* (2006.01)

(52) U.S. Cl.
CPC .......... *G03F 7/0002* (2013.01); *G03F 7/0022* (2013.01); *B29C 43/021* (2013.01); *B29C 2033/426* (2013.01); *B29C 2043/025* (2013.01); *G05B 15/00* (2013.01)

(58) Field of Classification Search
CPC .................................................. G03F 7/0002
See application file for complete search history.

(56) References Cited

U.S. PATENT DOCUMENTS

| | | | | |
|---|---|---|---|---|
| 7,309,225 | B2 * | 12/2007 | McMackin | G03F 7/0002 264/1.36 |
| 7,941,234 | B2 * | 5/2011 | Aihara | G03F 7/70525 700/83 |
| 9,494,874 | B2 * | 11/2016 | Chen | G03F 7/70641 |
| 9,965,577 | B2 * | 5/2018 | Kamon | G03F 7/0002 |
| 2011/0057354 | A1 * | 3/2011 | Aoki | B82Y 10/00 264/293 |
| 2017/0015045 | A1 * | 1/2017 | Yamaguchi | B05B 1/30 |
| 2018/0329315 | A1 * | 11/2018 | Hirano | G03F 7/0002 |
| 2018/0370091 | A1 * | 12/2018 | Aihara | G03F 9/7088 |

FOREIGN PATENT DOCUMENTS

| | | |
|---|---|---|
| JP | 2004281806 A | 10/2004 |
| JP | 2008509825 A | 4/2008 |
| JP | 2011061029 A | 3/2011 |
| JP | 2018195811 A | 12/2018 |
| WO | 2006017793 A2 | 2/2006 |

\* cited by examiner

*Primary Examiner* — Benjamin A Schiffman
(74) *Attorney, Agent, or Firm* — Carter, DeLuca & Farrell LLP

(57) ABSTRACT

An imprint apparatus that forms a pattern made of an imprint material on each of a plurality of shot regions of a substrate, includes a user interface configured to allow a user to perform editing for assigning each of the plurality of shot regions to any one of a plurality of groups such that each of the plurality of groups is formed by at least one shot region onto which the imprint material is continuously supplied from a dispenser.

19 Claims, 30 Drawing Sheets

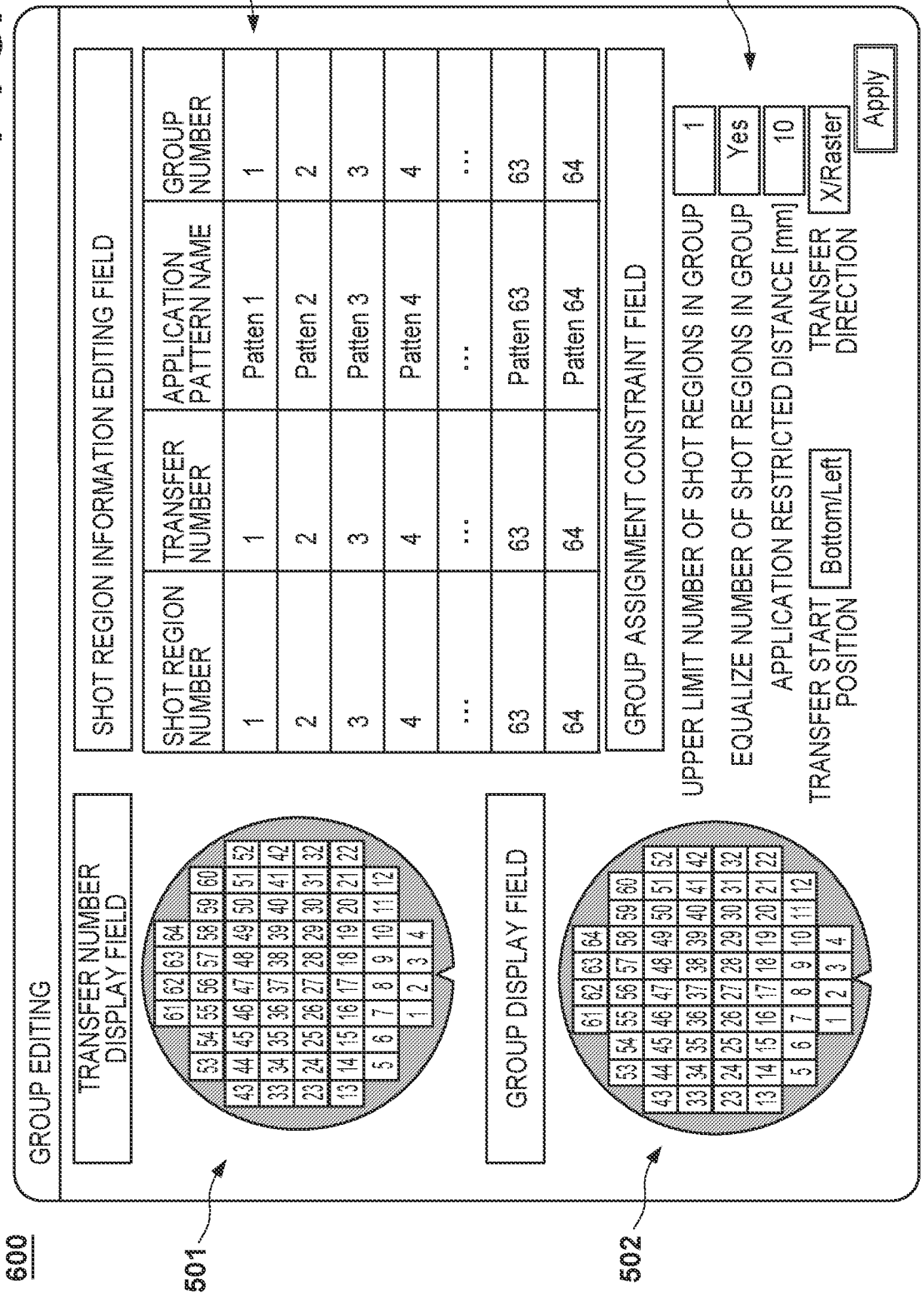

| TRANSFER NUMBER | APPLICATION PATTERN NAME | GROUP NUMBER |
|---|---|---|
| 1 | Patten 1 | 1 |
| 2 | Patten 2 | 1 |
| 3 | Patten 1 | 2 |
| 4 | Patten 2 | 1 |
| 5 | Patten 1 | 2 |

FIG. 22A
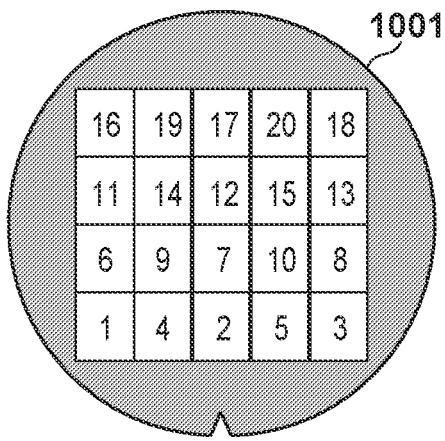
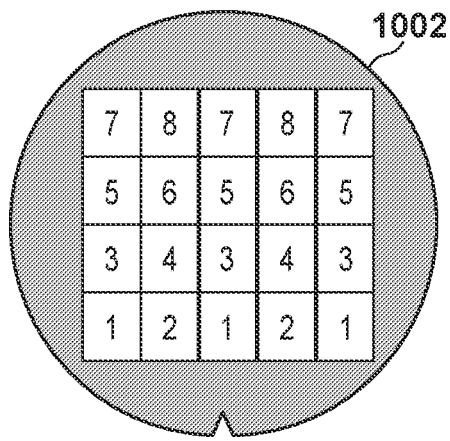
FIG. 22B
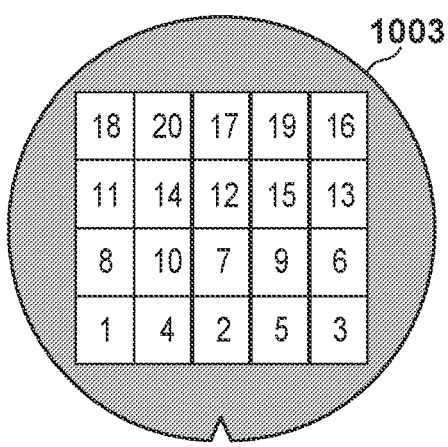
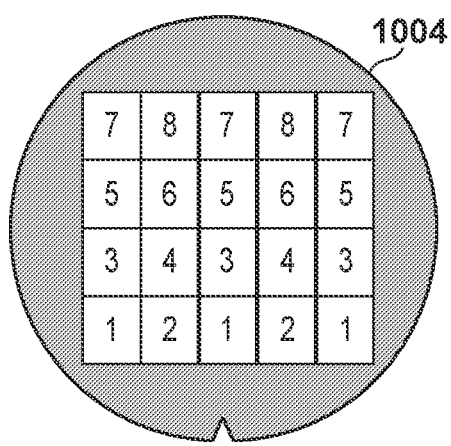
FIG. 22C
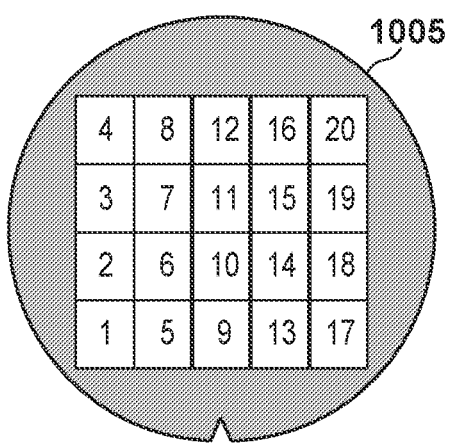
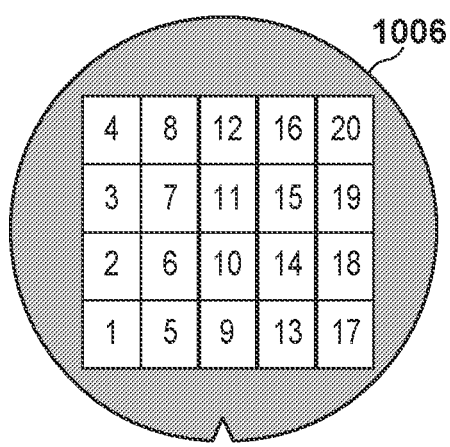

FIG. 24A
| TRANSFER NUMBER | 1 | 2 | 3 | 4 | 5 |
| GROUP NUMBER | 1 | 2 | 3 | 4 | 5 |
FIG. 24B
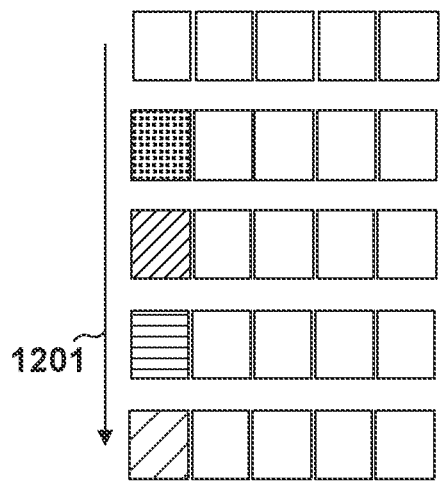
FIG. 24C
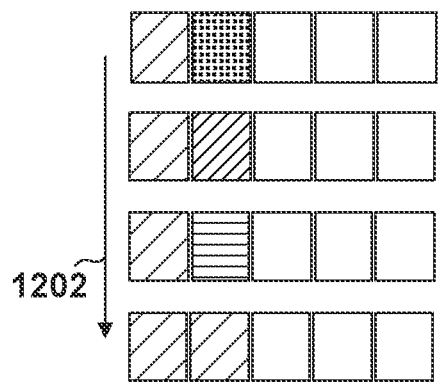
FIG. 24D
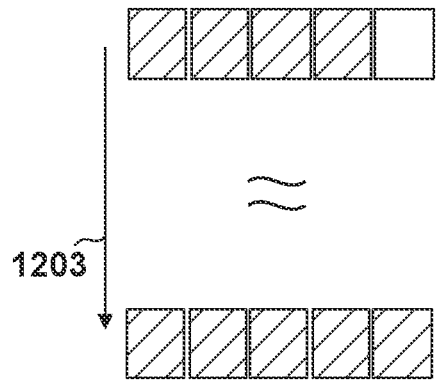

FIG. 25A
| TRANSFER NUMBER | 1 | 2 | 3 | 4 | 5 |
| GROUP NUMBER | 1 | 2 | 3 | 4 | 5 |
FIG. 25B
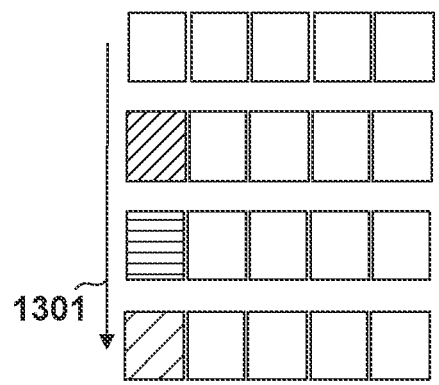
FIG. 25C
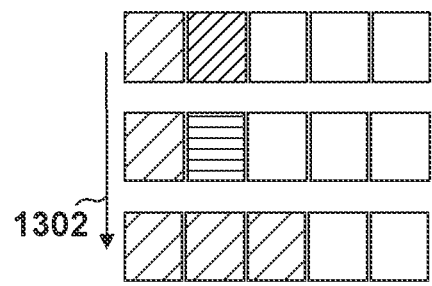
FIG. 25D
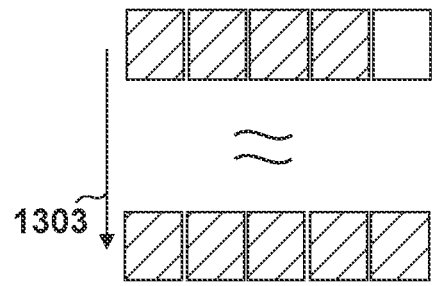

FIG. 26A
| TRANSFER NUMBER | 1 | 4 | 2 | 5 | 3 |
| GROUP NUMBER | 1 | 2 | 1 | 2 | 1 |
FIG. 26B
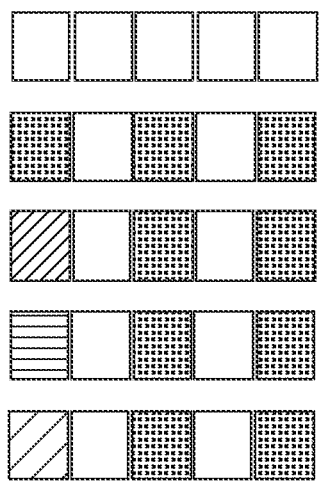
FIG. 26C
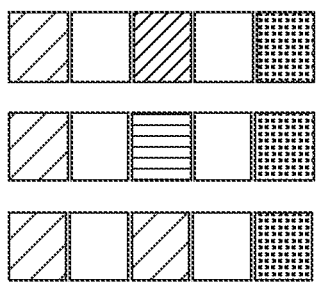
FIG. 26D
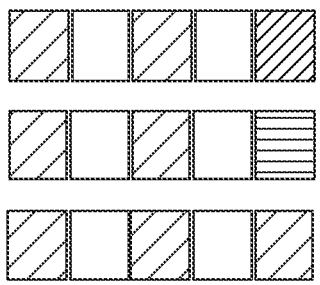

FIG. 29A
| TRANSFER NUMBER | 1 | 4 | 2 | 5 | 3 |
|---|---|---|---|---|---|
| GROUP NUMBER | 2 | 1 | 2 | 1 | 2 |
FIG. 29B
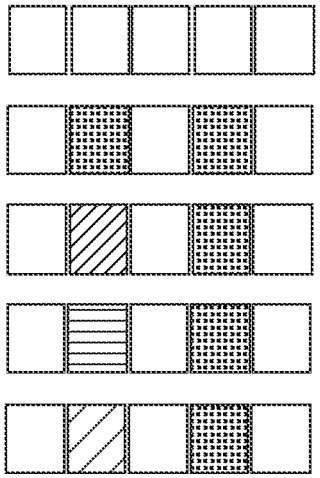
1701
FIG. 29C
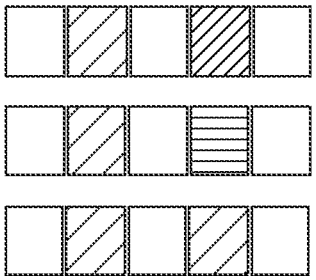
1702

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint apparatus forms a pattern made of a cured product of an imprint material on each of a plurality of shot regions of a substrate. In one type of imprint apparatus, a process in which an imprint material is arranged on one shot region of a substrate by a dispenser, a mold is brought into contact with the imprint material, and the imprint material is cured is executed for each of a plurality of shot regions. In another type of imprint apparatus, a process in which an imprint material is continuously arranged by a dispenser on at least two shot regions of a substrate, a mold is brought into contact with the imprint material, and the imprint material is cured is continuously executed for the at least two shot regions. In still another type of imprint apparatus, a process in which a substrate on which an imprint material has been arranged by an external apparatus is loaded, a mold is brought into contact with the imprint material, and the imprint material is cured is continuously executed for a plurality of shot regions of the substrate.

Conventionally, a function of allowing a user to edit a group of shot regions in which an imprint material is continuously arranged by a dispenser has not been provided, and the degree of freedom of operation of an imprint apparatus has been low.

SUMMARY OF THE INVENTION

The present invention provides a technique advantageous in improving the degree of freedom of operation of an imprint apparatus.

One of aspects of the present invention provides an imprint apparatus that forms a pattern made of an imprint material on each of a plurality of shot regions of a substrate, the apparatus comprising a user interface configured to allow a user to perform editing for assigning each of the plurality of shot regions to any one of a plurality of groups such that each of the plurality of groups is formed by at least one shot region onto which the imprint material is continuously supplied from a dispenser.

Further features of the present invention will become apparent from the following description of exemplary embodiments with reference to the attached drawings.

BRIEF DESCRIPTION OF THE DRAWINGS

FIG. 6 is a view exemplarily showing an interface screen provided on a display by a user interface;

FIGS. 22A to 22C are views each showing a result of automatic assignment executed by the controller;

FIGS. 24A to 24D are views schematically showing images displayed on the display by the user interface during execution of the imprint process;

FIGS. 25A to 25D are views schematically showing images displayed on the display by the user interface during execution of the imprint process;

FIGS. 26A to 26F are views schematically showing images displayed on the display by the user interface during execution of the imprint process;

FIGS. 29A to 29F are views schematically showing images displayed on the display by the user interface during execution of the imprint process;

DESCRIPTION OF THE EMBODIMENTS

Figure 1:
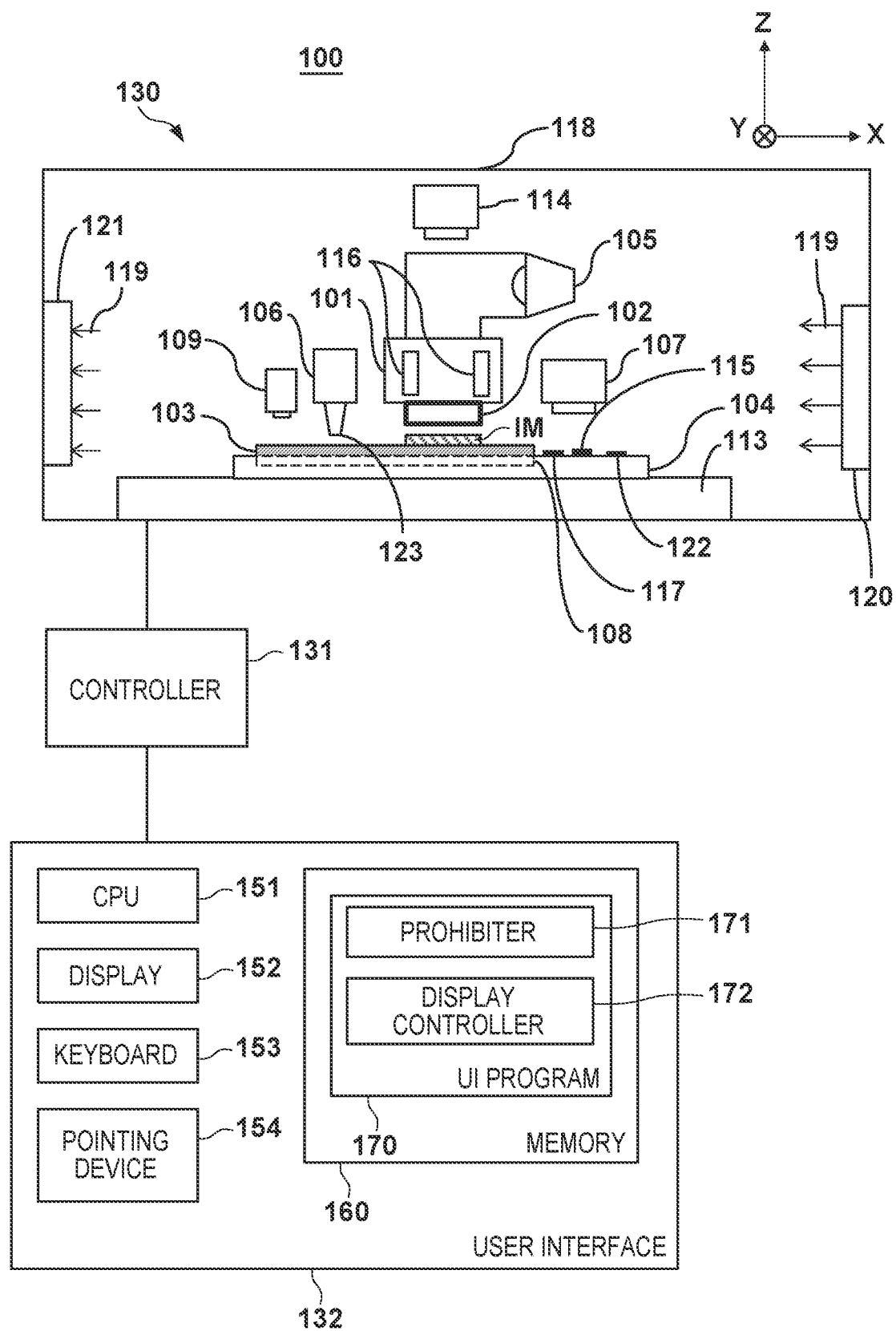
FIG. 1 is a view showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of an imprint apparatus 100 according to an embodiment. The imprint apparatus 100 can include, for example, an imprint apparatus main body 130, a controller 131, and a user interface 132. The controller 131 and the user interface 132 may be integrally formed. The imprint apparatus 100 forms a pattern made of a cured product of an imprint material IM on each of a plurality of shot regions of a substrate 103.

As the imprint material IM, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material IM can be arranged on the substrate in the form of droplets or in the form of an island or film formed by connecting a plurality of droplets. The viscosity (the viscosity at 25° C.) of the imprint material IM can be, for example, 1 mPa·s (inclusive) to 100 mPa·s (inclusive).

As the material of the substrate 103, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass. The upper surface of the substrate 103 may be spin-coated in advance with a preparation liquid mixture containing an additive for reducing the surface energy.

In the specification and the accompanying drawings, directions will be indicated on an XYZ coordinate system in which directions parallel to the surface of the substrate 103 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation.

The imprint apparatus 100 or the imprint apparatus main body 130 can include a stage base 113, a substrate stage 104, and a stage driving mechanism (not shown) that drives the substrate stage 104 on the stage base 113. The stage driving mechanism can be configured to drive the substrate 103 concerning a plurality of axes (for example, three axes including the X-, Y-, and θZ-axes, preferably, six axes including the X- Y-, Z-, θX-, θY-, and θZ-axes). The substrate stage 104 can include a substrate holder 108 that holds the substrate 103. The substrate holder 108 can includes, for example, a plurality of suction regions.

Figure 2A:
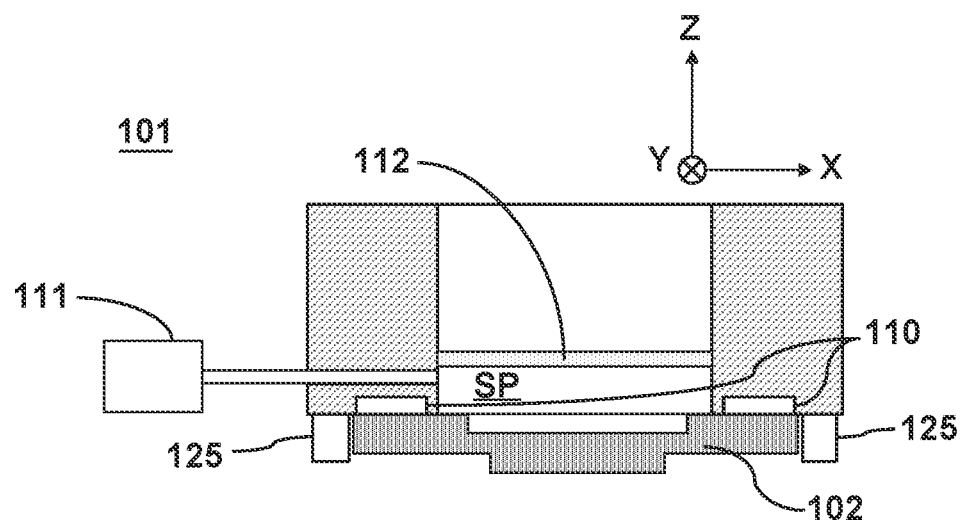
FIG. 2A is a view showing an arrangement example of an imprint head.

The imprint apparatus 100 or the imprint apparatus main body 130 can include an imprint head 101 that drives a mold 102. The imprint head 101 can be configured to drive the mold 102 concerning a plurality of axes (for example, three axes including the Z-, θX-, and θY-axes, preferably, six axes including the X- Y-, Z-, θX-, θY-, and θZ-axes). FIG. 2A shows an arrangement example of the imprint head 101. The imprint head 101 can include a mold holder 110 that holds the mold 102, a window portion 112 that defines a space SP on the back surface (the surface opposite to the surface that contacts the imprint material IM on the substrate 103) side of the mold 102, and a pressure controller 111 that controls the pressure in the space SP. By making the pressure in the space SP higher than the pressure in the external space, the mold 102 can be deformed into a convex shape toward the substrate 103 side. The imprint head 101 can bring the mold 102 into contact with the imprint material IM on the substrate 103 by bringing the mold 102 close to the substrate 103. Further, the imprint head 101 can separate the mold 102 from the imprint material IM on the substrate 103 by moving the mold 102 away from the substrate 103.

The imprint apparatus 100 or the imprint apparatus main body 130 may include a gas supplier 125. The gas supplier 125 may be arranged in, for example, the imprint head 101. The gas supplier 125 can supply a purge gas to the space between the substrate 103 and the mold 102. As the purge gas, in addition to helium gas, a gas containing at least one of nitrogen gas and a condensable gas (for example, pentafluoropropane (PFP)) can be used. The purge gas is advantageous in improving the filling property of the imprint material IM into the space between the substrate 103 and the mold 102 and suppressing curing defects of the imprint material IM caused by impediment of curing of the imprint material IM by oxygen.

Figure 2B:
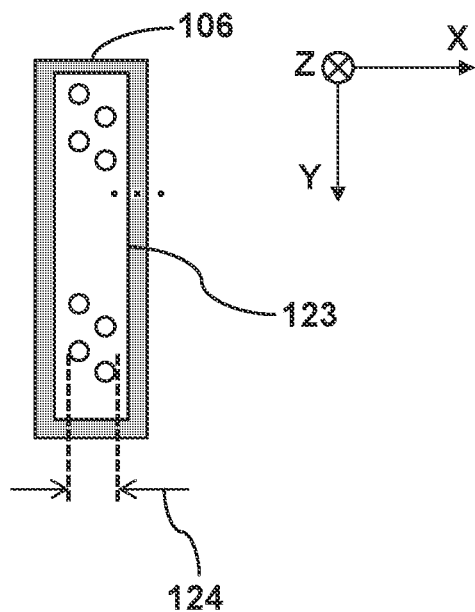
FIG. 2B is a view showing an arrangement example of a dispenser.

The imprint apparatus 100 or the imprint apparatus main body 130 can include a dispenser 106 that arranges the imprint material IM on the substrate 103. The dispenser 106 can also be referred to as a supplier that supplies the imprint material IM onto the substrate 103 or an applicator that applies the imprint material IM onto the substrate 103. In this specification, arranging the imprint material IM on the substrate is also referred to as applying the imprint material IM onto the substrate. The meaning of "applying" can be interpreted in the broadest sense. For example, discharging the imprint material IM from a discharge port and supplying or arranging it onto the substrate can be included in the concept of "applying". FIG. 2B shows an arrangement example of the dispenser 106. The dispenser 106 can include a discharge surface 123 on which a plurality of discharge ports for discharging the imprint material IM are arranged. The plurality of discharge ports can be arranged to form an array including, for example, one to several discharge ports in the X direction and thousands of discharge ports in the Y direction. Each discharge port can have a size of about several μm to several ten μm, for example. The distance between the discharge surface 123 and the substrate 103 can be in a range of, for example, about several hundred μm to 1 mm.

The imprint apparatus 100 or the imprint apparatus main body 130 can include a curing unit 105. The curing unit 105 can cure the imprint material IM in a state in which the imprint material IM on the substrate 103 is in contact with the mold 102 and the concave portion forming the pattern of the mold 102 is filled with the imprint material IM. In order to cure the imprint material IM, the curing unit 105 can be configured to irradiate the imprint material IM with curing energy (for example, light such as ultraviolet light) through the window portion 112 and the mold 102. In order to provide a more specific example, the curing unit 105 will be described hereinafter as being configured to irradiate the imprint material IM with light as curing energy. The exposure amount for curing the imprint material IM can be adjusted, for example, by controlling the exposure time or the voltage of a light source included in the curing unit 105.

The imprint apparatus 100 or the imprint apparatus main body 130 may include an illuminance detector 122. The illuminance detector 122 can be arranged on the substrate stage 104, for example. The substrate stage 104 is positioned so as to arrange the illuminance detector 122 at a position where the illuminance detector 122 is irradiated with light from the curing unit 105, so that the illuminance detector 122 can detect the illuminance of the light emitted by the curing unit 105. The controller 131 can control the voltage of the light source of the curing unit 105 or the exposure time based on the illuminance detected by the illuminance detector 122.

When the imprint material IM is a single molecule sequential photoreaction system, the reaction rate of the imprint material IM with respect to the exposure amount is proportional to the illuminance of the exposure light×the irradiation time of the exposure light. When the imprint material IM is a photo radical polymerization reaction system, the reaction rate of the imprint material IM with respect to the exposure amount is proportional to ($\sqrt{}$(the illuminance of the exposure light))×(the exposure time of the exposure light). The viscoelasticity of the imprint material IM can be designed such that the imprint material IM is easily filled in the concave portion forming the pattern of the mold 102. By performing exposure (irradiating with light) by the curing unit 105, the photocuring reaction of the imprint material IM is promoted and its viscoelasticity increases.

The imprint apparatus 100 or the imprint apparatus main body 130 may include a substrate height measuring instrument 109. The substrate height measuring instrument 109 can include, for example, an optical distance measuring sensor. The substrate height measuring instrument 109 can measure the height of the surface of the substrate 103 with respect to a reference plane. The reference plane can be a design reference height. The imprint apparatus 100 or the imprint apparatus main body 130 may include a mold height measuring instrument 117. The mold height measuring instrument 117 can include, for example, an optical distance measuring sensor. The mold height measuring instrument 117 can measure the height of the pattern surface of the mold 102 with respect to the reference surface.

The imprint apparatus 100 or the imprint apparatus main body 130 may include an on-axis alignment scope 116. The on-axis alignment scope 116 can be used to detect the relative position between a mark on the mold 102 and a mark on the substrate 103 or to detect the relative position between a mark on the mold 102 and a mark 115 on the substrate stage 104. For example, an optical position detection apparatus disclosed in Japanese Patent Laid-Open No. 2008-509825 is applicable to detect these relative positions. In particular, in a measurement method using a moire signal formed by two marks, high measurement accuracy can be obtained with a simple optical system. In addition, since a high-accuracy optical system is not required for detection of a moire signal, it is possible to employ a low-resolution (low-NA) scope. This is advantageous in arranging a plurality of scopes. For example, it is possible to employ a configuration in which marks at the four corners of a shot region are simultaneously measured.

The imprint apparatus 100 or the imprint apparatus main body 130 may include an off-axis alignment scope 107. The off-axis alignment scope 107 is, for example, a sensor of optical position detection type, and can be used to detect the relative position between the mark on the mold 102 and the mark 115 on the substrate stage 104. The imprint apparatus 100 or the imprint apparatus main body 130 may include a filling observation camera 114 for observing the filling of the imprint material IM into the space between the substrate 103 and the mold 102.

The above-described components of the imprint apparatus main body 130 can be accommodated in a clean chamber 118. The clean chamber 118 can include an air flow generator including a gas supplier 120 that supplies a gas to a space inside the clean chamber 118 and a gas recovery unit 121 that recovers the gas from the space. The clean chamber 118 may further include a chemical filter (not shown) and a particle filter (not shown). The air flow generator can generate an air flow 119 for discharging heat and particles generated in the clean chamber 118. The air flow generator may generate the air flow 119 in a space between the dispenser 106 and the substrate 103 or the substrate stage 104. The direction of the air flow 119 is desirably a constant direction so that the imprint material IM discharged from the dispenser 106 is not hindered from being uniformly arranged on the substrate 103. The direction of the air flow 119 is parallel to the X direction in FIG. 1, but the direction of the air flow 119 may be parallel to the Y direction. The gas supplier 120 takes in the atmosphere in a clean room, removes chemical substances and particles slightly contained in the atmosphere by the chemical filter and particle filter, and supplies the clean air obtained thereby from a blower port (not shown) to the space inside the clean chamber 118. The gas recovery unit 121 can include a vacuum pump.

Figure 3:
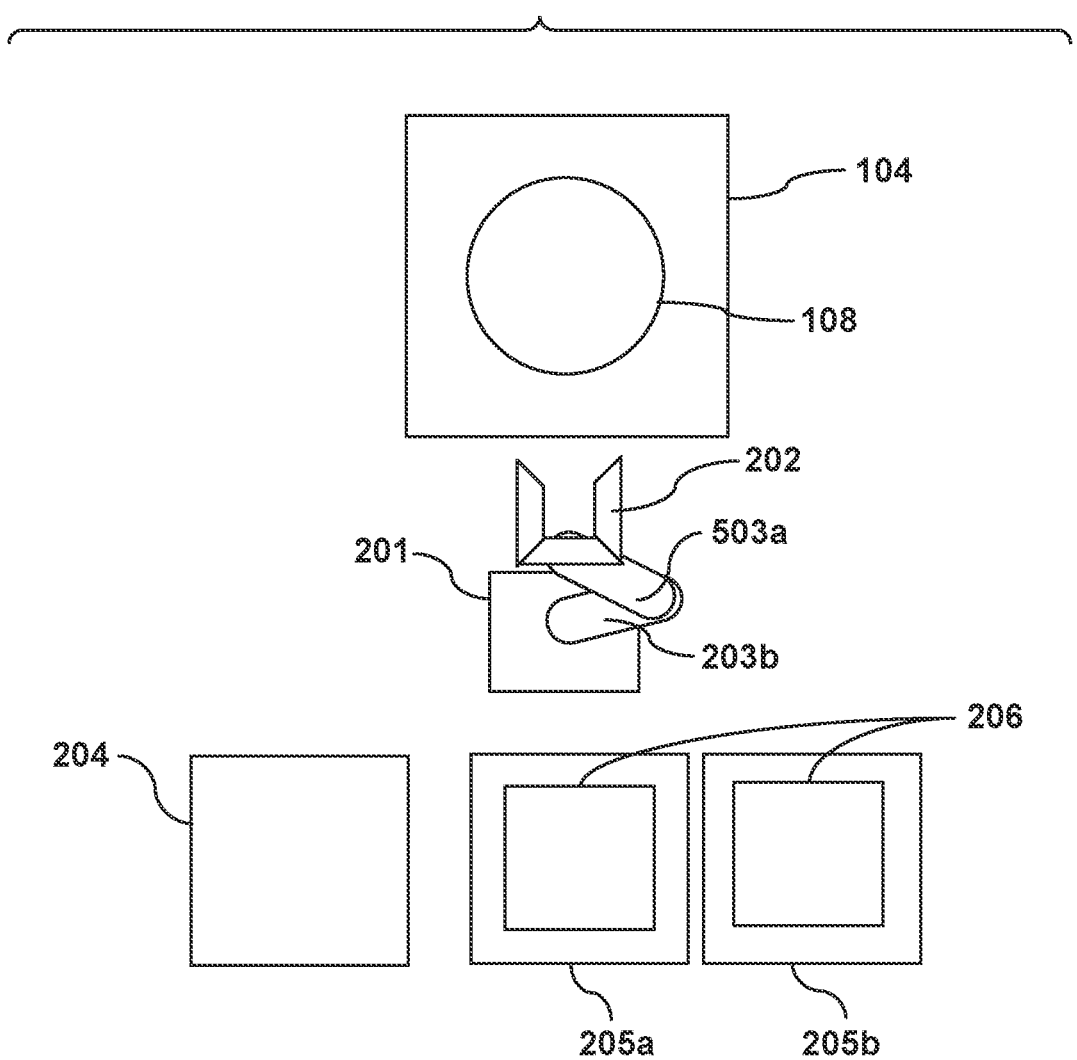
FIG. 3 is a view exemplarily showing a substrate carrying unit that can be included in the imprint apparatus or an imprint apparatus main body.

FIG. 3 is a view exemplarily showing a substrate carrying unit 201 that can be included in the imprint apparatus 100 or the imprint apparatus main body 130. The substrate carrying unit 201 can include, for example, carrying arms 203a and 203b that can rotate and extend in a horizontal plane, and a carrying hand 202 that can rotate in a horizontal plane. The carrying hand 202 includes a suction portion on its upper surface, and can hold the substrate 103 by sucking the substrate 103. The imprint apparatus 100 or the imprint apparatus main body 130 can include a first substrate carrying in/out portion 205a, a second substrate carrying in/out portion 205b, and a substrate storage portion 204. A substrate carrier 206 holding a plurality of substrates 103 can be carried into and out from each of the first substrate carrying in/out portion 205a and the second substrate carrying in/out portion 205b. The carrying hand 202 can carry the substrates 103 one by one to each of the substrate stage 104, an arbitrary slot of the substrate storage portion 204, and an arbitrary slot of the substrate carrier 206 mounted on the first substrate carrying in/out portion 205a or the second substrate carrying in/out portion 205b.

Figure 4A:
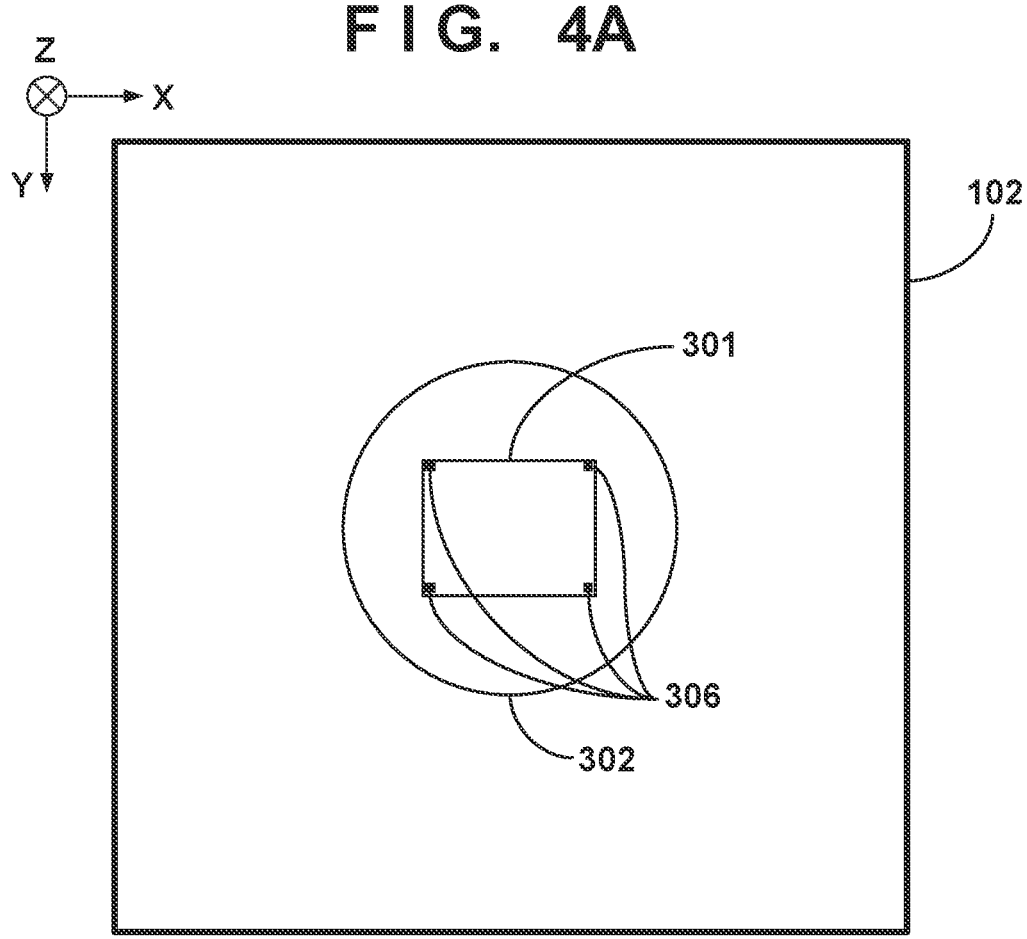
FIGS. 4A and 4B are views showing an arrangement example of a mold.
Figure 4B:
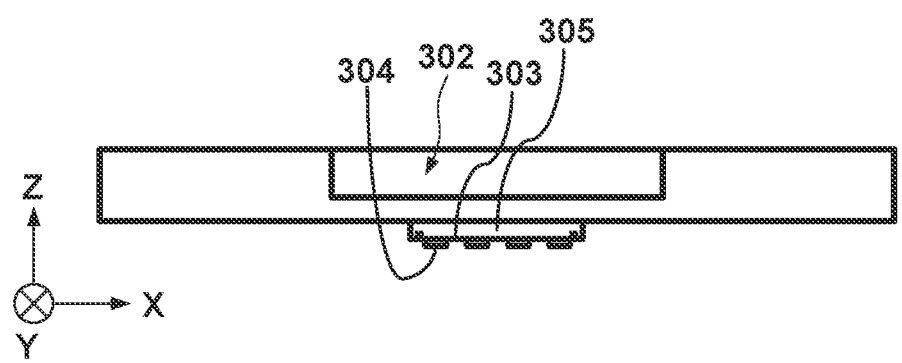

FIGS. 4A and 4B are views showing an arrangement example of the mold 102. The mold 102 can be made of, for example, any one of fused quartz, an organic polymer, and a metal, but may be made of another material. The mold 102 can include a cavity 302 in the central portion on the back surface side. The thickness of the mold 102 in the cavity 302 can be, for example, about 1 mm. Among the opposite surfaces of the mold 102, the surface that contacts the imprint material IM on the substrate 103 can be referred to as a first surface, and the surface on the cavity 302 side can be referred to as a second surface. The mold 102 can include a pattern portion 301 on the first surface. The center of the pattern portion 301 can coincide with the center of the cavity 302. The pattern portion 301 can include a pattern base portion 305 and a pattern arranged on the pattern base portion 305. The pattern base portion 305 can have a thickness of about 30 µm, for example. The pattern can include, for example, a feature of several nm or ten-odd nm in a case of a minute pattern. The pattern can include a convex portion 304 and a concave portion 303. The height (depth) of the step formed by the convex portion 304 and the concave portion 303 can be, for example, about several ten nm to several hundred nm. Marks 306 used by the on-axis alignment scope 116 can be arranged on the pattern base portion 305.

Figure 5A:
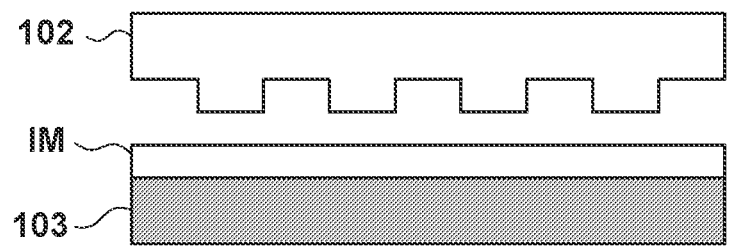
FIGS. 5A to 5F are views exemplarily showing a method of processing a substrate by an imprint process.
Figure 5B:
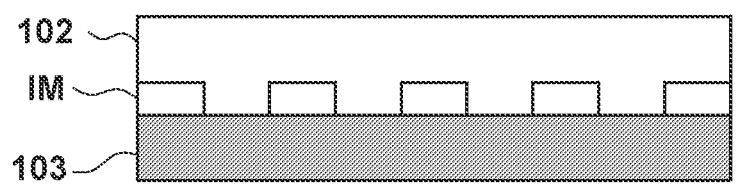

FIGS. 5A to 5F exemplarily show a method of processing the substrate 103 by an imprint process. First, as shown in FIG. 5A, the imprint material IM is arranged on the substrate 103 by the dispenser 106. For example, the imprint material IM can be arranged at the target position on the substrate 103 by discharging the imprint material IM from the dispenser 106 in synchronization with the movement of the substrate stage 104 (substrate 103) in the X direction. Then, as shown in FIG. 5B, the mold 102 can be driven by the imprint head 101 so that the imprint material IM on the substrate 103 and the mold 102 come into contact with each other. Thus, the imprint material IM is filled in the concave portion of the pattern portion of the mold 102.

Figure 5C:
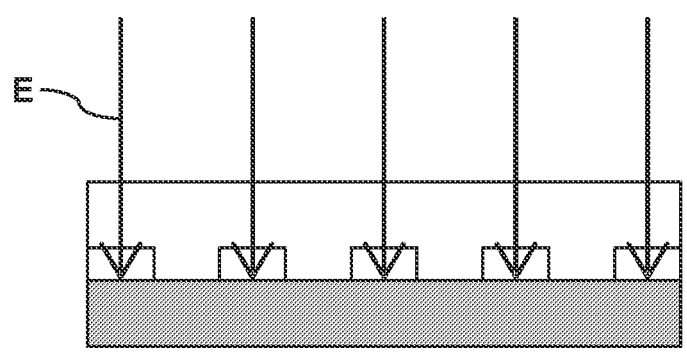
Figure 5D:
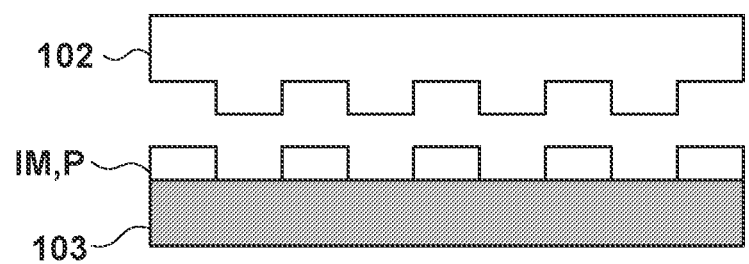

Then, as shown in FIG. 5C, the curing unit 105 irradiates the imprint material IM with curing energy E. As a result, the imprint material IM is cured and a pattern P made of a cured product of the imprint material IM is formed. Subsequently, as shown in FIG. 5D, the mold 102 can be driven by the imprint head 101 so that the mold 102 is separated from the pattern P made of the cured product of the imprint material IM. The process shown in FIGS. 5A to 5D can be executed in the imprint apparatus 100.

Figure 5E:
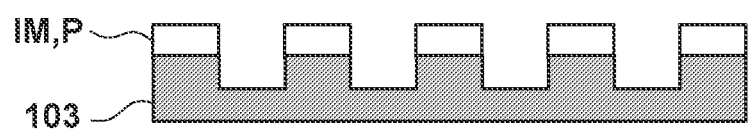
Figure 5F:

Then, as shown in FIG. 5E, the substrate 103 is etched using the pattern P as an etching mask. Thus, the pattern P can be transferred to the substrate 103. Thereafter, as shown in FIG. 5F, the pattern P can be removed from the substrate 103.

Returning back to FIG. 1, the controller 131 controls the imprint apparatus main body 130. The controller 131 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

The user interface 132 can form, for example, an interface that allows a user to set a condition for controlling a process executed in the imprint apparatus 100, edit information for controlling the process, and the like. The user interface 132 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

In one example, the user interface 132 can be formed by incorporating a user interface program 170 into a computer that includes an input device and an output device. The input device can include, for example, a keyboard 153 and a pointing device 154. The output device can include a display 152. In the example shown in FIG. 1, the user interface 132 is formed by incorporating the user interface program (to be simply referred to as a "program" hereinafter) 170 into a computer that includes a CPU 151, the display 152, the keyboard 153, the pointing device 154, and a memory 160. The program 170 can be stored in the memory 160. The program 170 can be provided to the computer by being stored in a memory medium or via a communication line.

The user interface 132 can operate to allow a user to perform editing for assigning each of the plurality of shot regions of the substrate 103 to any one of a plurality of groups. This editing can be performed such that each of the plurality of groups is formed by at least one shot region to which the imprint material IM is continuously supplied from the dispenser 106.

The program 170 can operate the user interface 132 so as to include a prohibiter 171 that prohibits the user from performing editing that does not satisfy a preset constraint. In another aspect, the user interface 132 can include the prohibiter 171 that prohibits a user from performing editing that does not satisfy a preset constraint. The prohibiter 171 may prohibit the user from performing specific editing that does not satisfy a preset constraint and may not prohibit the user from performing another specific editing that does not satisfy the preset constraint. Alternatively, the prohibiter 171 may prohibit the user from performing editing that does not satisfy a first preset constraint and may not prohibit the user from performing editing that does not satisfy a second preset constraint. The operation of the prohibiter 171 may be temporarily stopped by the user. For example, when the user wants to edit the group and/or transfer order, the operation of the prohibiter 171 can be temporarily stopped by the user.

The program 170 can operate the user interface 132 so as to include a display controller 172 that displays, in response to the user selecting an editing target, a candidate that satisfies the constraint described above with respect to the editing target. In another aspect, the user interface 132 can include the display controller 172 that displays, in response to the user selecting an editing target, a candidate that satisfies the constraint described above with respect to the editing target. Instead of or in addition to such a function, the display controller 172 may have a function of displaying an error that occurs when editing that does not satisfy a preset constraint has been performed.

The constraint described above can include, for example, at least one of a constraint on an interval between shot regions to be satisfied by shot regions belonging to one group and a constraint on the upper limit number of shot regions belonging to one group. The user interface 132 can be configured to allow the user to perform editing for assigning the order of forming a pattern made of a cured product of the imprint material IM (transfer order of transferring the pattern of the mold 102) to each of the plurality of shot regions. The constraint described above may include a constraint on the arranging direction of shot regions onto which the imprint material is to be continuously supplied from the dispenser 106. The constraint described above may include a constraint that prohibits formation of a pattern made of a cured product of an imprint material in each of shot regions of another group before the pattern made of the cured product of the imprint material IM is formed in each of all shot regions forming a group.

In another aspect, the imprint apparatus 100 executes an imprint process in which the imprint material IM is arranged on each of the plurality of shot regions of the substrate 103, the imprint material IM is brought into contact with the mold 102, and the imprint material IM is cured. With this imprint process, the pattern P made of a cured product of the imprint material IM is formed. The imprint apparatus 100 can include the user interface 132 that displays an image indicating the progress of the imprint process on the display 152. The image can include, for example, an image indicating that the imprint material IM has been arranged on a shot region, an image indicating that the imprint material IM is in contact with the mold 102, and an image indicating that the imprint material IM has been cured.

The controller 131 can operate to control a transfer process for forming a pattern made of a cured product of the imprint material IM on each of the plurality of shot regions of the substrate 103 in accordance with the result of editing performed using the user interface 132. The controller 131 can operate so as to remove a shot region in which the total supply amount of the imprint material IM is set to 0 from the group to which the shot region belongs. Here, the shot region in which the total supply amount of the imprint material IM is set to 0 can be a shot region onto which an imprint material is supplied by an external apparatus. The controller 131 can execute a transfer process on such a shot region without supplying the imprint material by the dispenser 106. Alternatively, the controller 131 can execute a transfer process on such a shot region without supplying the imprint material by the dispenser 106 only when pattern formation on the shot region is permitted.

The controller 131 may automatically execute an operation of assigning each of the plurality of shot regions of the substrate 103 to any one of the plurality of groups. This operation can be executed such that each of the plurality of groups is formed by at least one shot region onto which the imprint material is continuously supplied from the dispenser 106. The user interface 132 can operate to allow the user to edit the result of automatic assignment executed by the controller 131.

The controller 131 and the user interface 132 may be integrally formed. In one example, the controller 131 can be formed by incorporating a program into a computer, and the user interface 132 can be formed by further incorporating the program 170 into the computer.

FIG. 6 exemplarily shows an interface screen 600 provided on the display 152 by the user interface 132. The user can perform editing for assigning each shot region to any one of the plurality of groups by operating the keyboard 153 and the pointing device 154 while viewing the interface screen 600. In addition, the user can edit the transfer order by operating the keyboard 153 and the pointing device 154 while viewing the interface screen 600.

The interface screen 600 can include a shot region information editing field 503. The shot region information editing field 503 can include, for example, a shot region number, a transfer number, an application pattern name, and a group number. The shot region number is a number (ID) that specifies each shot region, and one shot region number is preset for one shot region. The transfer number indicates the order in which the pattern of the mold 102 is transferred, and one transfer number can be assigned to one shot region. The transfer number can be an item that the user can edit. The application pattern name is a name (ID) that specifies an application pattern (also referred to as an application map) indicating the arrangement of the imprint material IM to be arranged using the dispenser 106, and is usually set in advance. In one example, a plurality of droplets of the imprint material IM are respectively arranged at a plurality of positions in a shot region, and the application pattern can include information indicating the plurality of positions. The application pattern may include information that specifies the amount of the imprint material IM at each of the plurality of positions. The group number is a number (ID) that specifies a group to which the shot region is assigned. The group number can be an item that the user can edit.

A transfer number display field 501 is a field that displays the transfer number assigned to each of the plurality of shot regions of the substrate 103. The transfer number can be displayed, for example, while being superimposed on layout information indicating the arrangement of the plurality of shot regions. For example, "1" in the transfer number display field 501 indicates the shot region where transfer is first executed. As described above, the transfer number can be edited in the shot region information editing field 503.

A group assignment constraint field 504 is a field for setting a constraint in a process in which the controller 131 automatically determines the group assignment and transfer procedure or a process in which the user manually determines the group assignment and transfer procedure. The group assignment constraint field 504 is a field for setting a constraint in editing for assigning each shot region to any one of the plurality of groups. The group assignment constraint field 504 can include a field ("upper limit number of shot regions in a group") for setting the upper limit number of shot regions that can be assigned to one group. Further, the group assignment constraint field 504 can include a field ("equalize the number of shot regions in a group") for setting whether the number of shot regions assigned to each group is equalized between groups. Here, if the upper limit number of shot regions in a group is set to 1, one group is formed by one shot region.

In addition, the group assignment constraint field 504 can include a field ("application restricted distance") for setting a minimum distance between two or more shot regions that can be assigned to one group. If the distance between two or more shot regions is larger than the minimum distance, the two or more shot regions can be assigned to one group. The group assignment constraint field 504 can include a field ("transfer start position") for setting a transfer start position, which is a position where transfer of the pattern of the mold 102 is started. For example, Bottom/Left indicates that the bottom and leftmost shot region is set to have transfer number=1. The group assignment constraint field 504 can include a field ("transfer direction") for setting a transfer direction, which is a direction in which continuous transfer is advanced. For example, X/Raster indicates that a transfer number is assigned such that raster scanning is performed in the X direction (scanning is performed in the +X direction).

Figure 21:
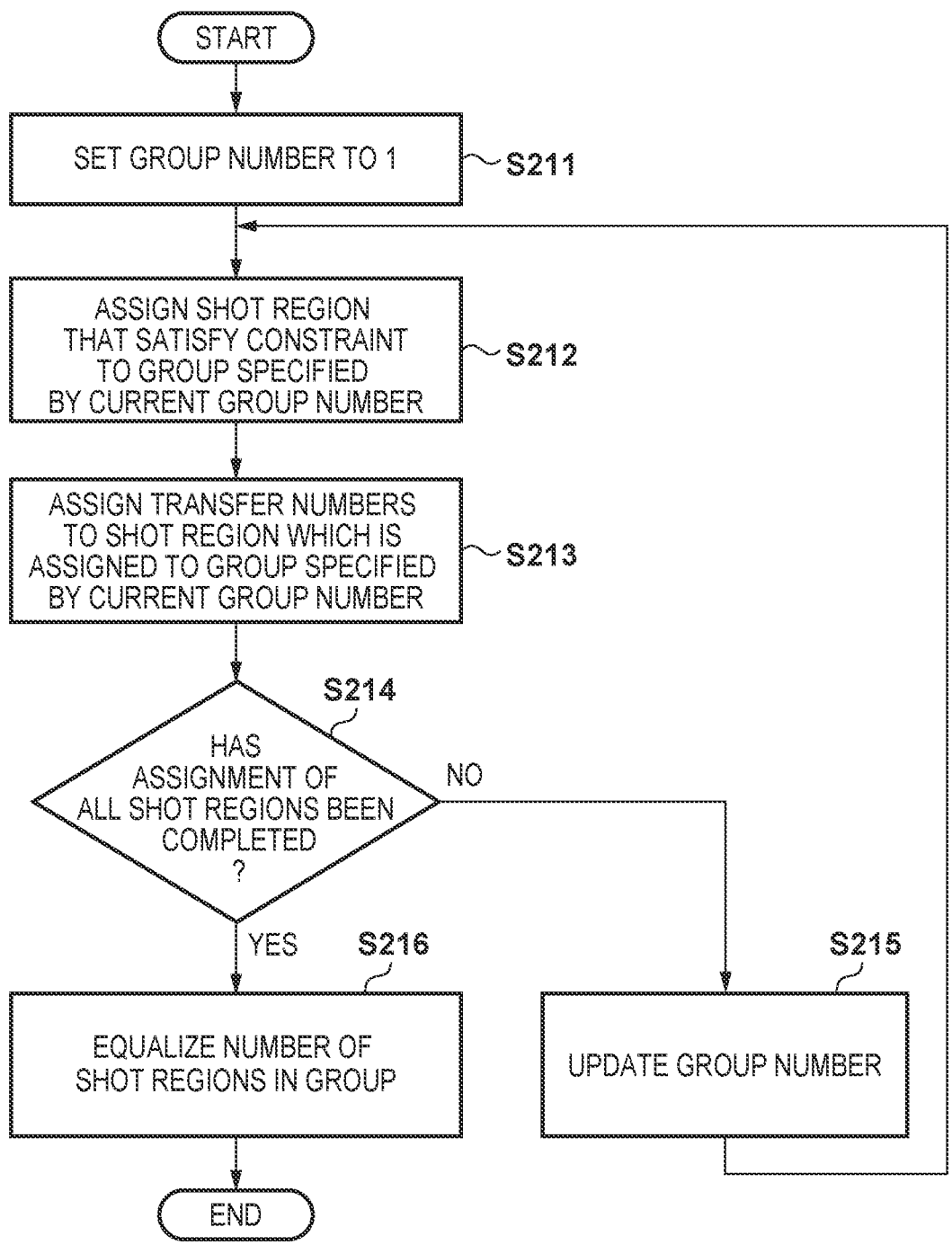
FIG. 21 is a flowchart illustrating an automatic assignment process executed by a controller.

FIG. 21 illustrates an automatic assignment process executed by the controller 131 in accordance with the constrains set in the group assignment constraint field 504. The automatic assignment process includes a process of assigning each shot region to any one of the plurality of groups and a process of assigning a transfer number to each shot region. The automatic assignment process illustrated in FIG. 21 can be executed, for example, in response to the user clicking the "Apply" button in the interface screen 600.

In step S211, the controller 131 sets the group number to 1. In step S212, the controller 131 can assign shot region that satisfies the constraints set in the group assignment constraint field 504 to the group specified by the current group number. More specifically, in step S212, the controller 131 can assign shot regions that have not been assigned to any one of groups to the group specified by the current group number based on the upper limit number of shot regions in a group, the transfer start position, and the transfer direction.

In step S213, the controller 131 assigns transfer numbers to the shot regions assigned in step S212. More specifically, in step S213, the controller 131 can assign transfer numbers to the shot regions assigned in step S212 based on the transfer start position and the transfer direction.

In step S214, the controller 131 determines whether all shot regions to be processed on the substrate 103 have been assigned to any one of groups by the execution of immediately preceding step S213. If the controller 131 determines that all shot regions to be processed have been assigned to any one of groups, the process advances to step S216; otherwise, the process advances to step S215. In step S215, the controller 131 adds 1 to the current group number and returns to step S212.

Step S216 is executed if the number of shot regions in a group is set to be equalized between the groups, and can be skipped otherwise. In step S216, the controller 131 equalizes the number of shot regions in a group between the groups. For example, assume that as a result of repeating the processing from steps S211 to S215, the number of shot regions assigned to each of the plurality of groups is {4, 4, 4, . . . , 4, 4, 1}. In this case, the controller 131 can change it to {4, 4, 4, . . . , 3, 3, 3}.

Figure 7:
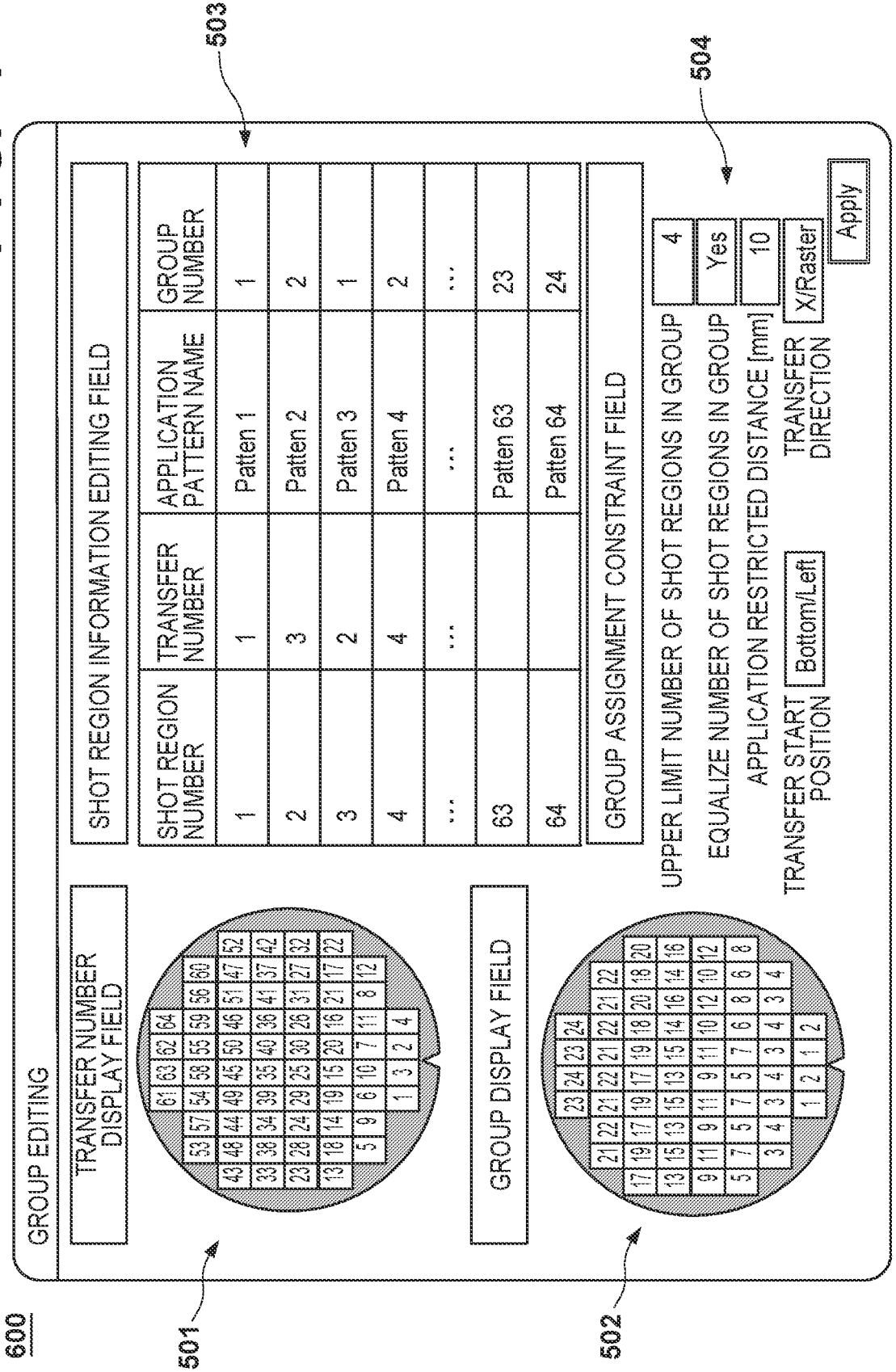
FIG. 7 is a view exemplarily showing the interface screen provided on the display by the user interface.

FIG. 7 exemplarily shows the result of the automatic assignment process illustrated in FIG. 21 executed by the controller 131. Note that this example is an example in which the following constraints are set in the group assignment constraint field 504 prior to execution of the automatic assignment process. That is, the upper limit number of shot regions that can be assigned to one group is set to 4 ("upper limit number of shot regions in a group"=4). In addition, a mode is set in which the number of shot regions assigned to each group is equalized between groups ("equalize the number of shot regions in a group"=Yes). Further, the minimum distance between two or more shot regions that can be assigned to one group is set to 10 mm ("application restricted distance"=10 mm). Furthermore, the transfer direction, which is a direction in which continuous transfer is advanced, is set to the +X direction ("transfer direction"=X/Raster). As a result of the automatic assignment, for example, the shot regions having shot region numbers=1 and 3 are assigned to the group having group number=1, and the shot regions having shot region numbers=2 and 4 are assigned to the group having group number=2. In addition, transfer numbers 1, 3, 2, and 4 are assigned to shot regions 1, 2, 3, and 4, respectively. The result of the automatic assignment is shown in the transfer number display field 501, a group display field 502, and the shot region information editing field 503.

Figure 8:
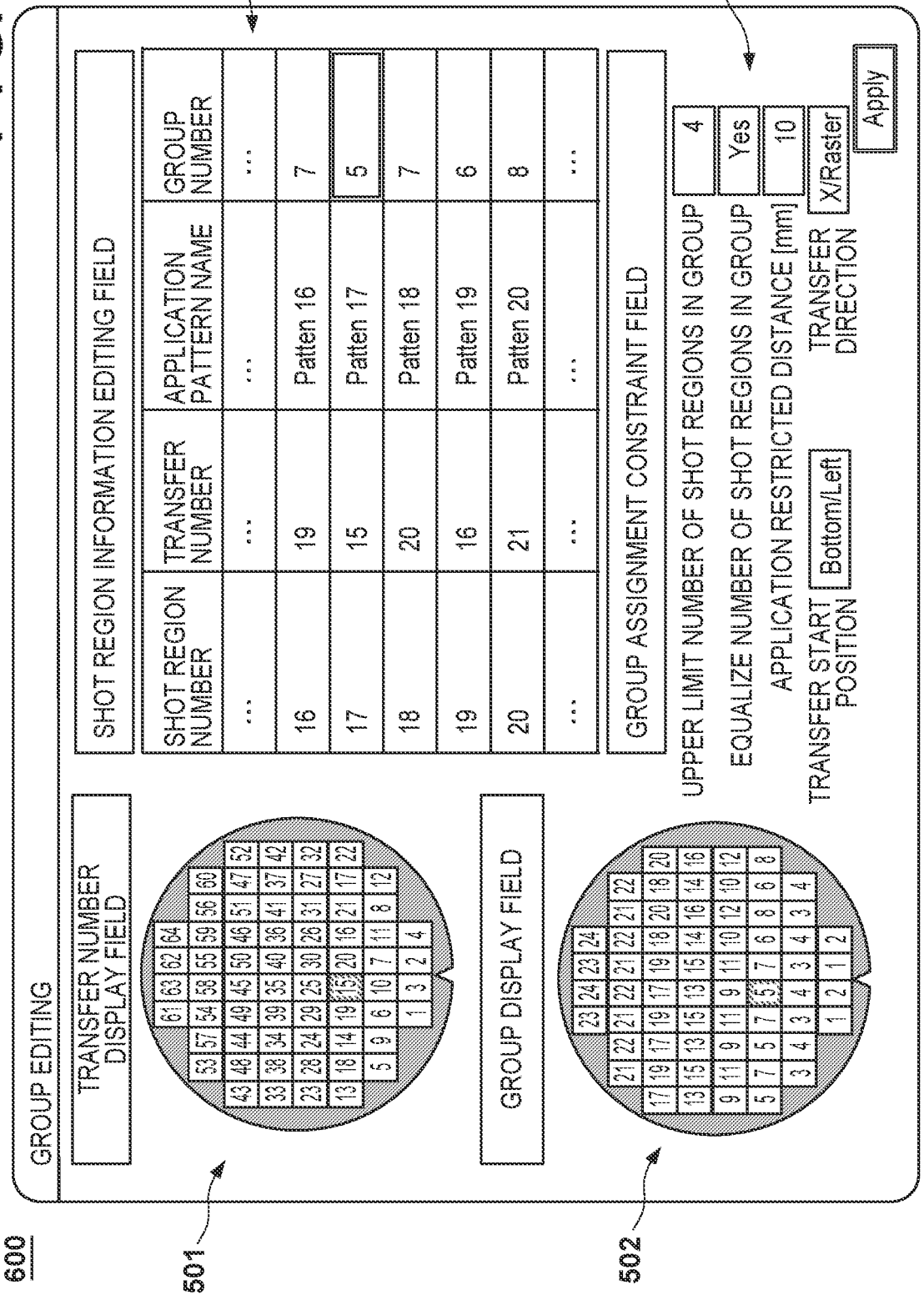
FIG. 8 is a view exemplarily showing the interface screen provided on the display by the user interface.
Figure 9:
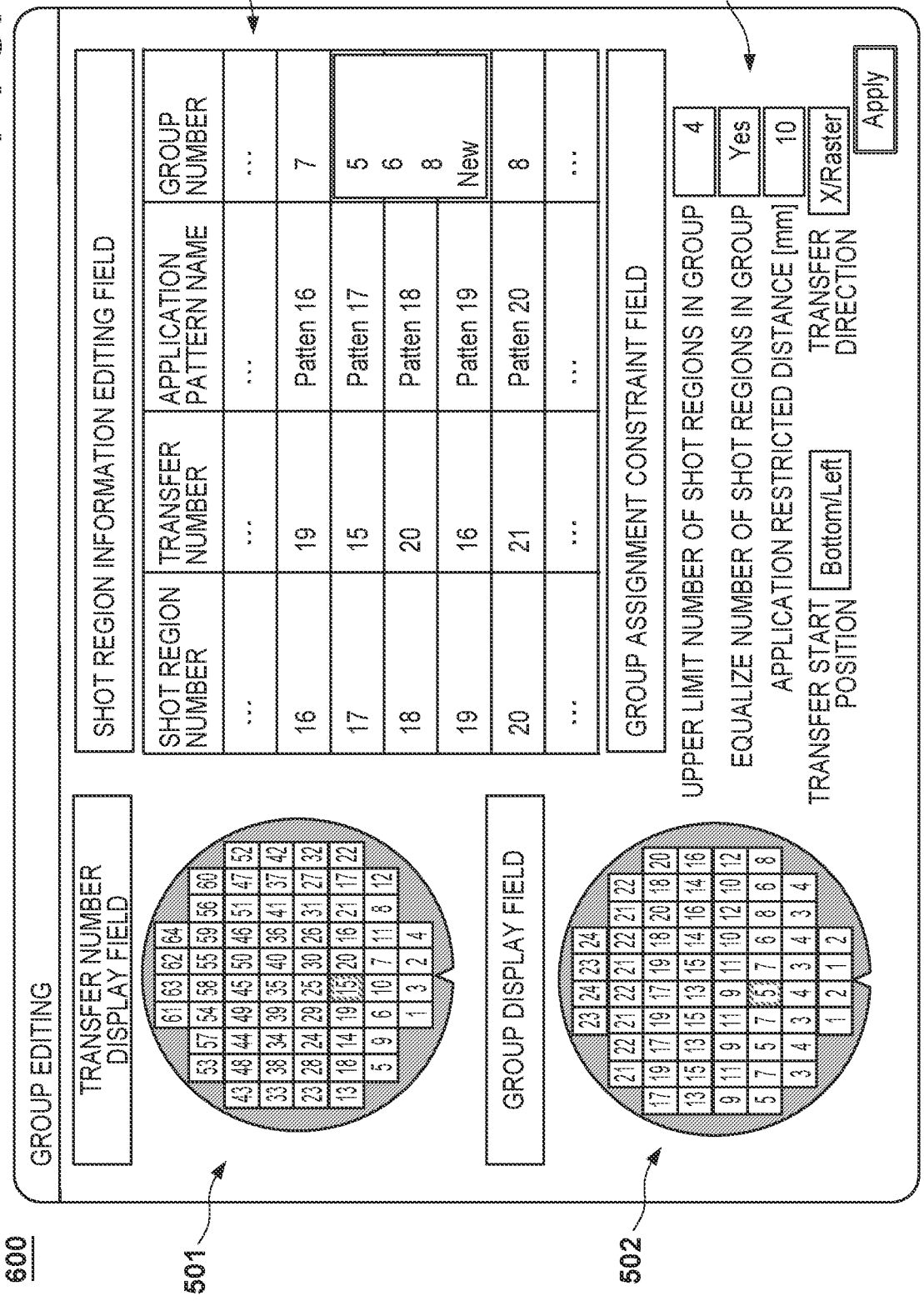
FIG. 9 is a view exemplarily showing the interface screen provided on the display by the user interface.
Figure 10:
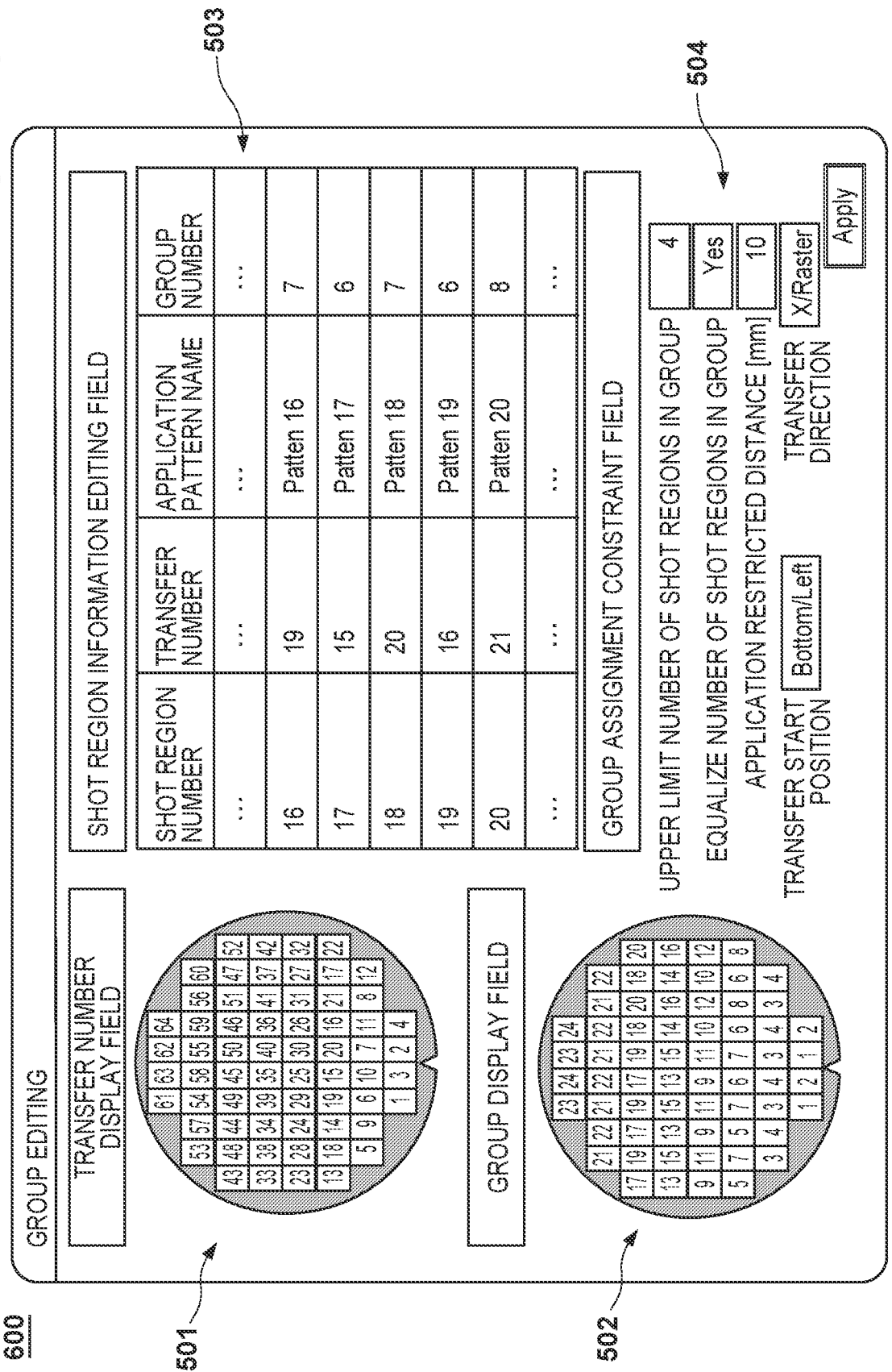
FIG. 10 is a view exemplarily showing the interface screen provided on the display by the user interface.

With reference to FIGS. 8, 9, and 10, an example in which the user manually edits the group (the shot region forming the group) using the user interface 132 will be exemplarily described below. In this example, the group to which the shot region having shot region number=17 belongs is changed from the group having group number=5 to the group having group number=6.

First, as shown in FIG. 8, group number=5 of the group to which the shot region having shot region number=17 belongs is selected by the user. In response to this, the display controller 172 can change group number=5 in the shot region information editing field 503 to a highlight state. At the same time, the display controller 172 can change transfer number=15 (transfer number assigned to the shot region having shot region number=17) in the transfer number display field 501 to a highlight state. Further, at the same time, the display controller 172 can change group number=5 (the group assigned to the shot region having shot region number=17) in the group display field 502 to a highlight state.

Next, as shown in FIG. 9, the display controller 172 displays candidates that satisfy the constraints preset in the group assignment constraint field 504 in the shot region information editing field 503 in the interface screen 600 of the display 152. In this example, group numbers=5, 6, and 8 and an undefined new group number ("New") satisfy the constraints described above. If group number=6 is selected, the group to which the shot region having shot region number=17 belongs is changed from the group having group number=5 to the group having group number=6 as shown in FIG. 10.

With reference to FIGS. 11, 12, 13, 14, and 15, an example in which the user manually edits the group (the shot region forming the group) and the transfer number using the user interface 132 will be exemplarily described below. In this example, editing is executed such that the imprint material is arranged by the dispenser 106 and the pattern of the mold 102 is transferred with respect to the shot regions having shot region numbers=1, 2, 3, and 4 in an order from the left side.

Figure 11:
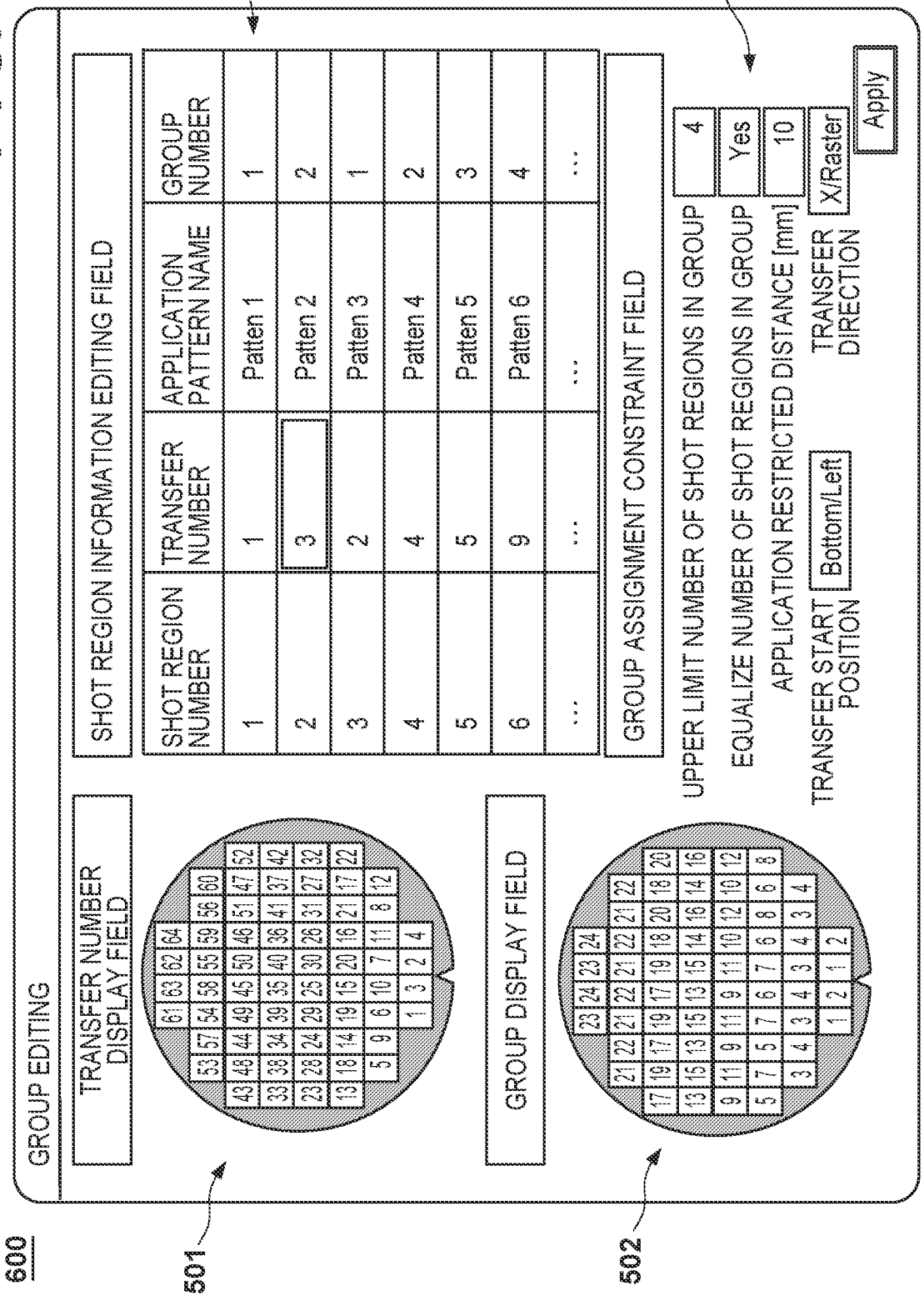
FIG. 11 is a view exemplarily showing the interface screen provided on the display by the user interface.
Figure 12:
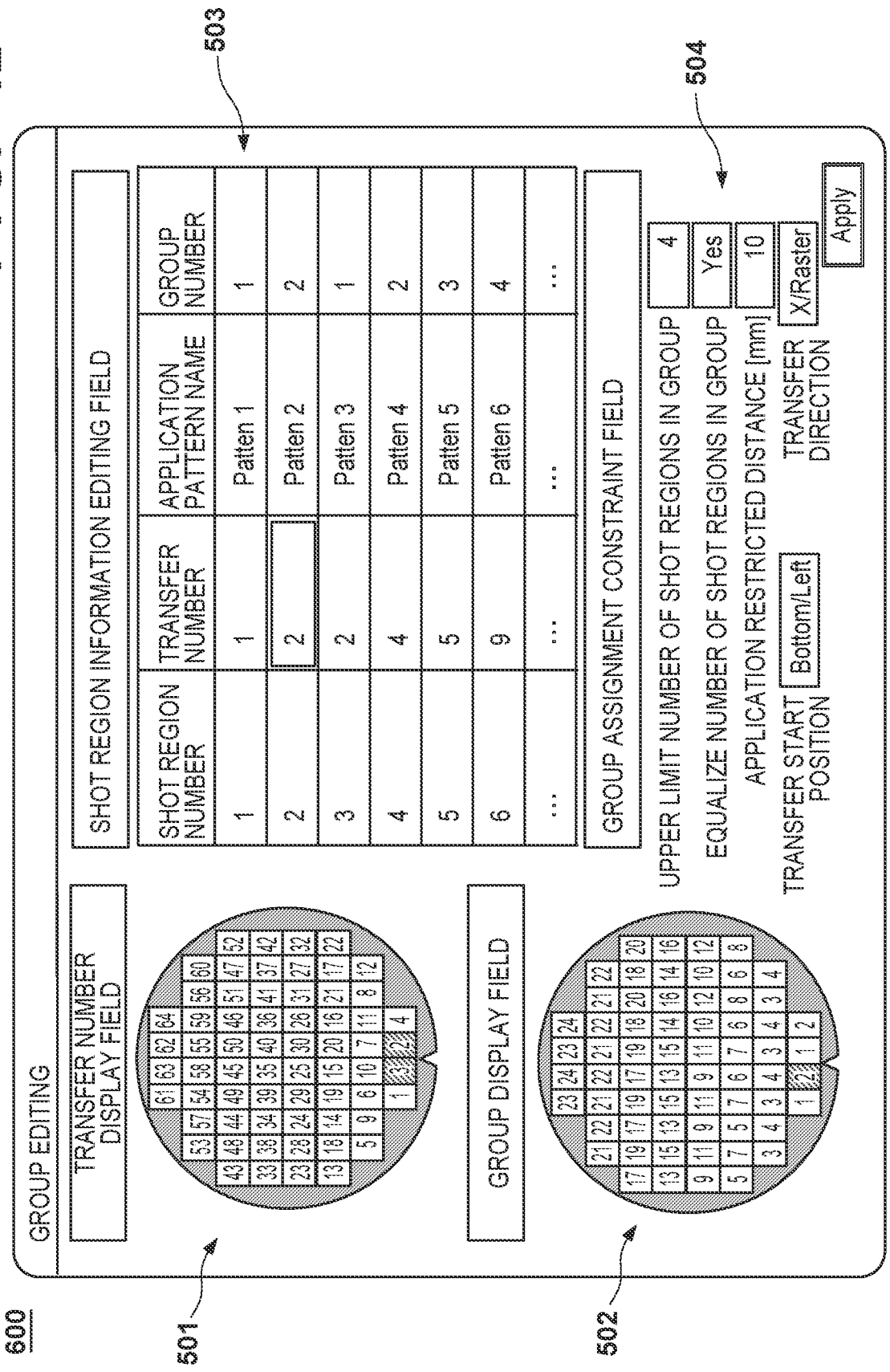
FIG. 12 is a view exemplarily showing the interface screen provided on the display by the user interface.

First, as shown in FIG. 11, transfer number=3 is selected by the user. In response to this, the display controller 172 can change transfer number=3 in the shot region information editing field 503 to a highlight state. Then, as shown in FIG. 12, transfer number=3 assigned to the shot region having shot region number=2 is changed to transfer number=2 by the user. This results in an error state in which transfer number=2 is assigned redundantly to the two shot regions having shot region numbers=2 and 3. In this case, as shown in FIG. 12, the display controller 172 can change shot region numbers=2 and 3 to which transfer number=2 has been assigned and the error state has occurred to an error display state in the transfer number display field 501.

Figure 13:
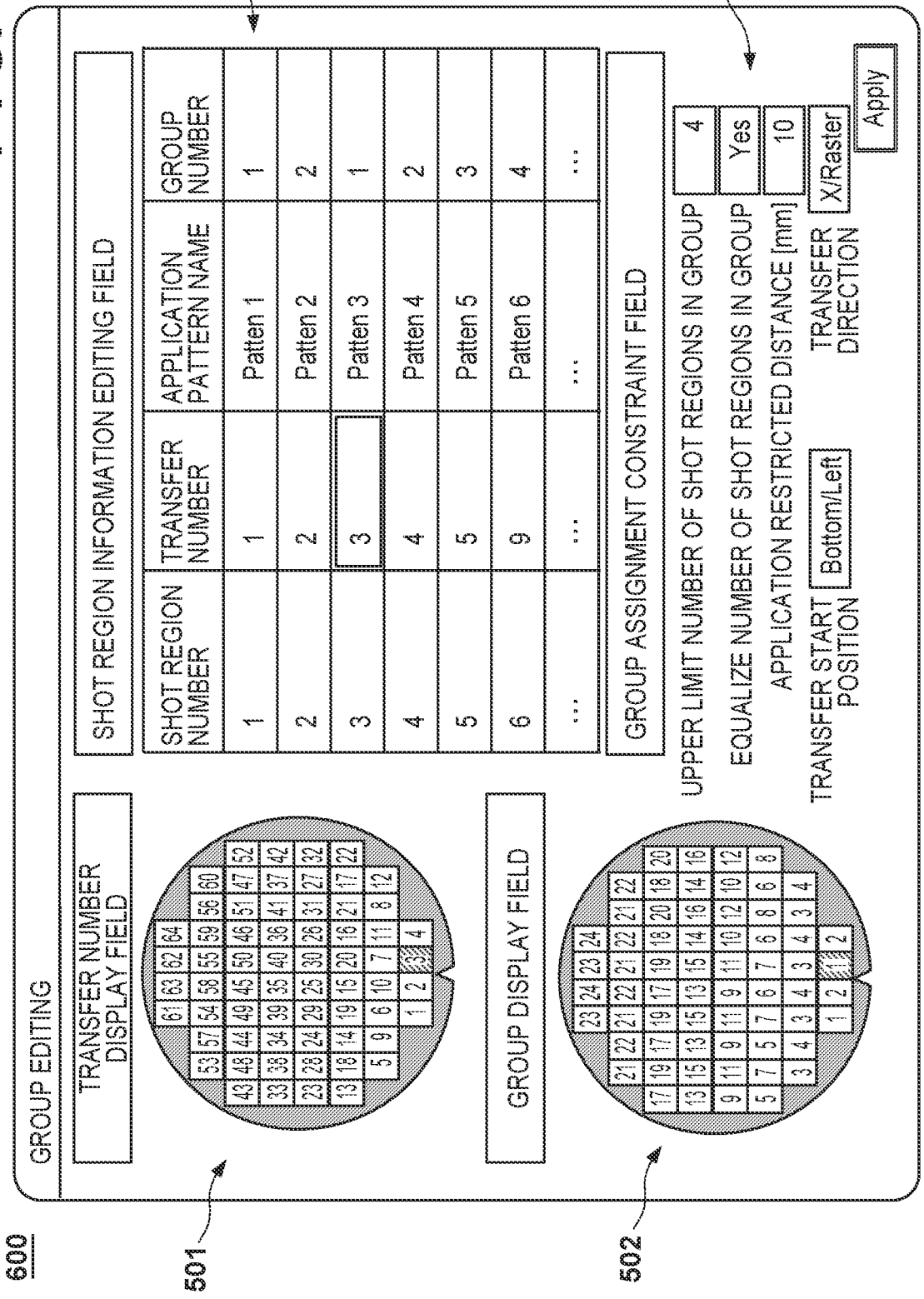
FIG. 13 is a view exemplarily showing the interface screen provided on the display by the user interface.

Next, as shown in FIG. 13, transfer number=2 assigned to the shot region having shot region number=3 is changed (corrected) to transfer number=3 by the user. This resolves the error state. As shown in FIG. 13, the display controller 172 can stop the error display in the transfer number display field 501 and change it to a highlight state to indicate that shot region number=3 is being selected.

Figure 14:
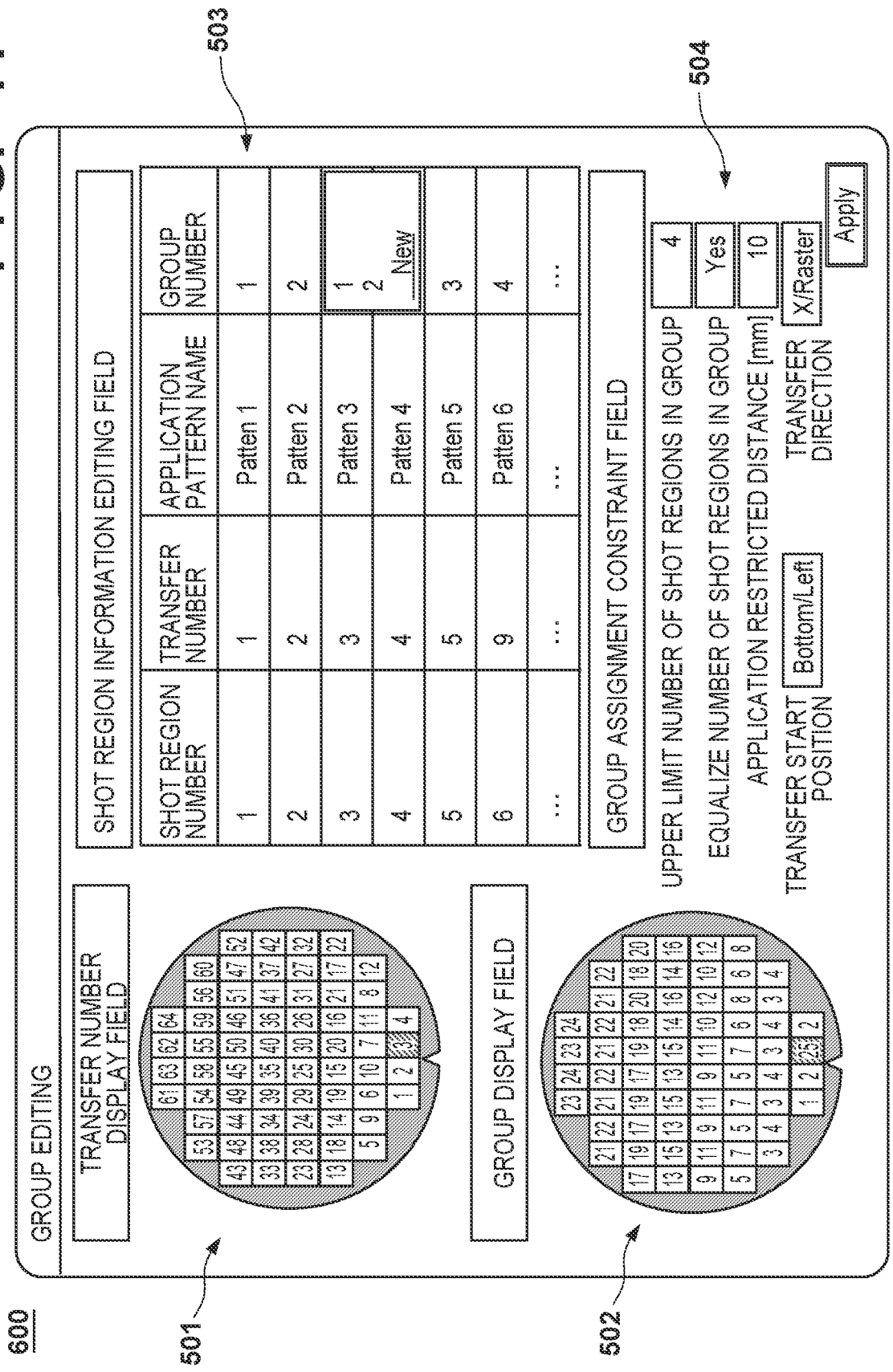
FIG. 14 is a view exemplarily showing the interface screen provided on the display by the user interface.

Next, as shown in FIG. 14, the group to which the shot region having shot region number=3 belongs is changed by the user. When the group number corresponding to shot region number=3 is clicked, the display controller 172 can display, in the shot region information editing field 503 in the interface screen 600 of the display 152, candidates that satisfy the constrains preset in the group assignment constraint field 504. In this example, group numbers=1 and 2 and an undefined new group number ("New") satisfy the constrains described above. Here, when "New" is selected by the user, the user interface 132 generates new group number=25 and assigns it to the shot region having shot region number=3.

Figure 15:
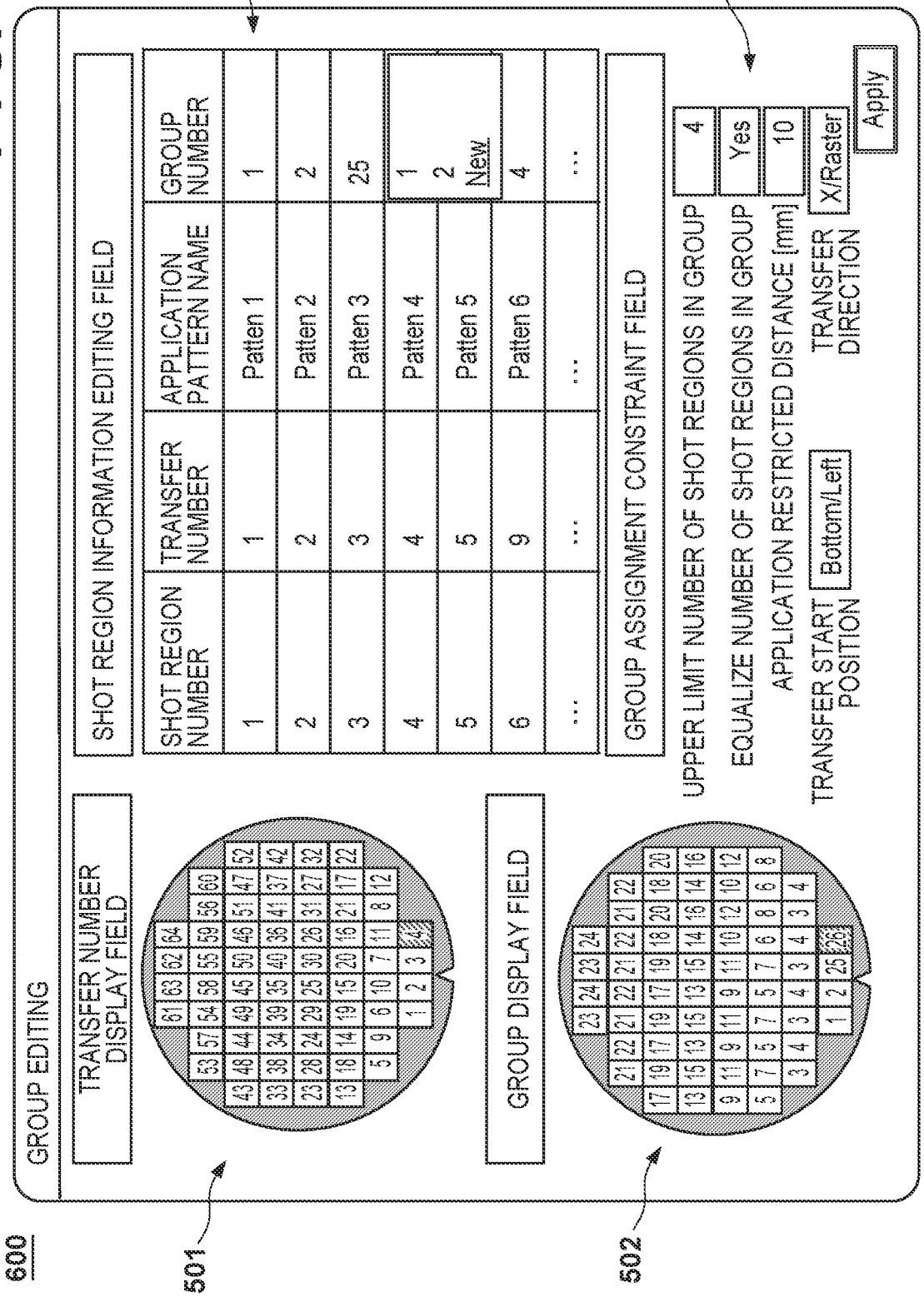
FIG. 15 is a view exemplarily showing the interface screen provided on the display by the user interface.

Next, group number assigned to the shot region having shot region number=4 is selected by the user. In response to this, as shown in FIG. 15, the display controller 172 can change transfer number=4 in the transfer number display field 501 to a highlight state. At the same time, the display controller 172 can change group number=2 (the group assigned to the shot region having shot region number=4) in the group display field 502 to a highlight state. In this example, group number=26 is assigned to the shot region having transfer number=4.

A method of continuously arranging the imprint material IM by the dispenser 106 with respect to the plurality of shot regions will be described below with reference to FIG. 17. In this example, for each shot region, the imprint material is arranged in forward scanning of the substrate 103 and the imprint material is arranged in backward scanning of the substrate 103. In addition, in this example, the shot regions having transfer numbers=1, 2, and 3 form one group. It is assumed that the positions (X positions) of the shot regions having transfer numbers=1, 2, and 3 in the X direction satisfy that the X position of the shot region having transfer number=1<the X position of the shot region having transfer number=2<the X position of the shot region having transfer number=3. In the shot region having transfer number=1, the imprint material is arranged in accordance with an application pattern 701 in the forward scanning, and the imprint material is arranged in accordance with an application pattern 704 in the backward scanning. In the shot region having transfer number=2, the imprint material is arranged in accordance with an application pattern 702 in the forward scanning, and the imprint material is arranged in accordance with an application pattern 705 in the backward scanning. In the shot region having transfer number=3, the imprint material is arranged in accordance with an application pattern 703 in the forward scanning, and the imprint material is arranged in accordance with an application pattern 706 in the backward scanning. The dispenser 106 is arranged on the −X direction side of the imprint head 101.

Figure 18A:
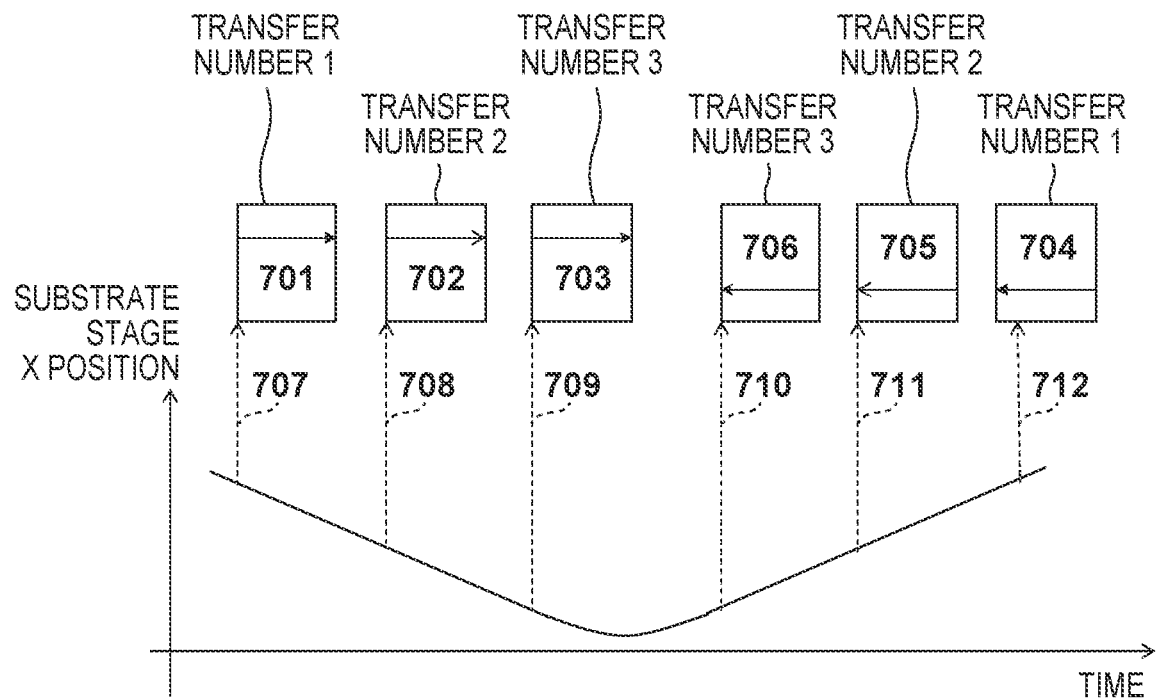
FIGS. 18A and 18B are graphs for explaining the method of continuously arranging the imprint material by the dispenser with respect to the plurality of shot regions.

FIG. 18A schematically shows an example of the X-direction position (X position) of the substrate stage 104 (substrate 103) and the imprint material supply timings for the shot regions having transfer numbers 1, 2, and 3. First, in the forward scanning, the imprint material is arranged in the shot regions having transfer numbers=1, 2, and 3 in accordance with the application patterns 701, 702, and 703, respectively. Then, in the backward scanning, the imprint material is arranged in the shot regions having transfer numbers=1, 2, and 3 in accordance with the application patterns 704, 705, and 706, respectively. The application patterns 701 to 706 are transferred to the dispenser 106 and, in response to discharge timing signals 707 to 712, the dispenser 106 starts discharging the imprint material onto the corresponding shot region. The method shown in FIG. 18A is excellent in that a unique application pattern can be assigned to each shot region and that the imprint material discharge start timing can be adjusted for each shot region.

Figure 18B:
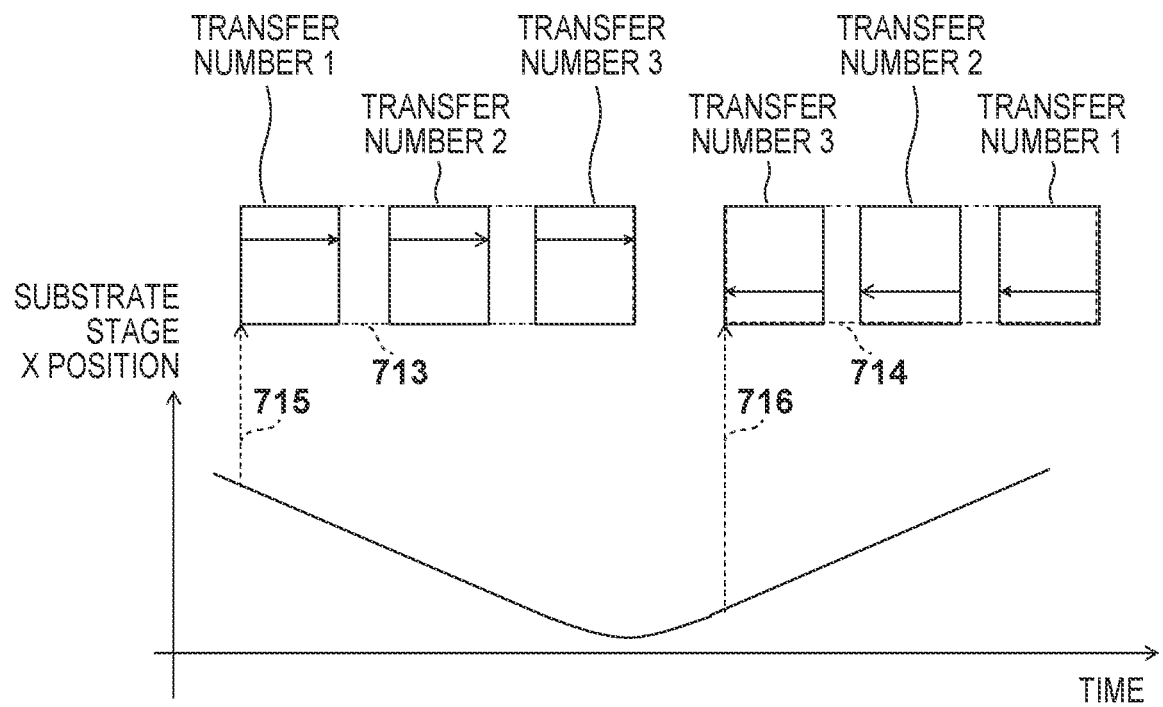

FIG. 18B schematically shows another example of the X-direction position (X position) of the substrate stage 104 (substrate 103) and the imprint material supply timings for the shot regions having transfer numbers 1, 2, and 3. In the example shown in FIG. 18B, in the forward scanning, the imprint material is arranged in each of the shot regions having transfer numbers=1, 2, and 3 in accordance with a common application pattern 713. In the backward scanning, the imprint material is arranged in each of the shot regions having transfer numbers=1, 2, and 3 in accordance with a common application pattern 714. The application patterns 713 and 714 are transferred to the dispenser 106 and, in response to discharge timing signals 715 and 716, the dispenser 106 starts discharging the imprint material onto the corresponding shot region. The method shown in FIG. 18B is excellent in that the application pattern need not be transferred to the dispenser 106 between the shot regions, and the imprint material can be continuously arranged in adjacent shot regions. This means that adjacent shot regions can be assigned to a same group.

Figure 19:
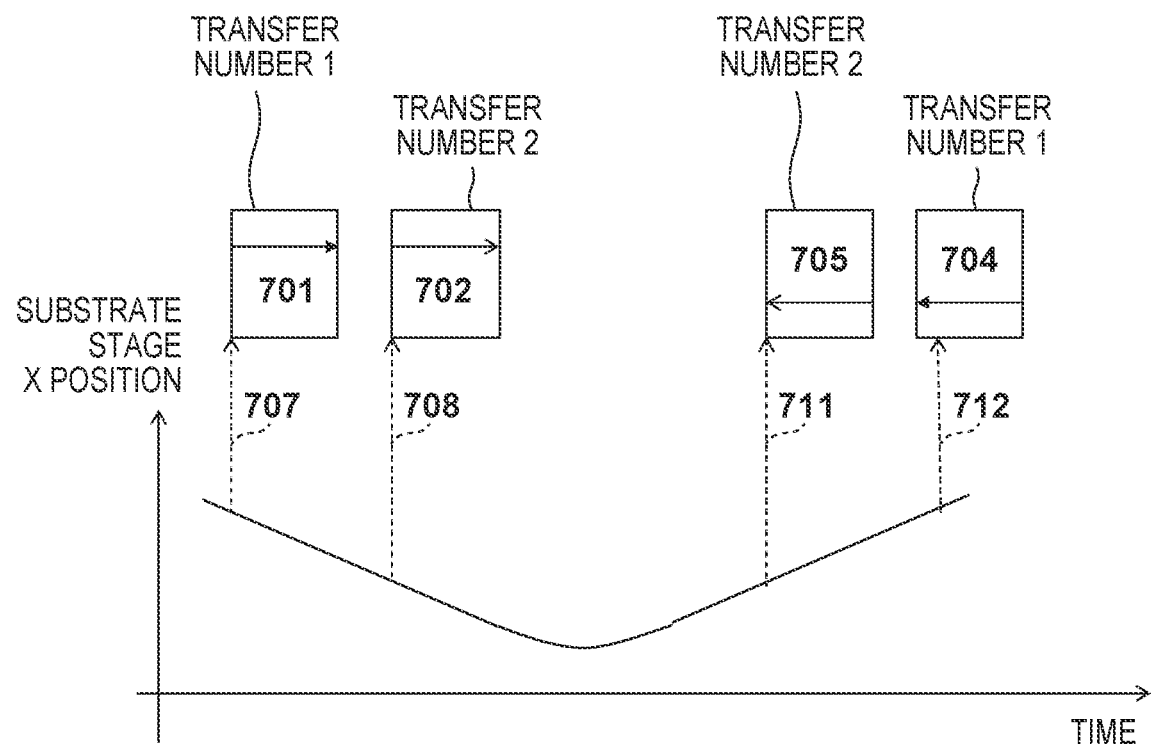
FIG. 19 is a graph for explaining the method of continuously arranging the imprint material by the dispenser with respect to the plurality of shot regions.

FIG. 19 shows an imprint material arrangement step executed by the dispenser 106 when the total supply amount of imprint material in accordance with each of the application patterns 703 and 706 is set to 0 in the shot region (corresponding to the shot region having transfer number=3 in FIG. 18A). In this case, the controller 131 can remove the shot region having transfer number=3 in which the total supply amount of imprint material in accordance with each of the application patterns 703 and 706 is set to 0 from the group formed by the shot regions having transfer numbers 1, 2, and 3. That is, the controller 131 arranges the imprint material only in the shot regions having transfer numbers 1 and 2. First, in the forward scanning, the imprint material is arranged in the shot regions having transfer numbers=1 and 2 in accordance with the application patterns 701 and 702, respectively. Then, in the backward scanning, the imprint material is arranged in the shot regions having transfer numbers=1 and 2 in accordance with the application patterns 704 and 705, respectively. The example shown in FIG. 19 is advantageous in eliminating unnecessary movement of the substrate stage 104, thereby improving throughput.

When one group is formed by two or more rows of shot regions, that is, when one group is formed by shot regions whose Y-direction positions are different, after reciprocal scanning is completed for one row, the reciprocal scanning can be executed for the next row.

Figures 16, 17:
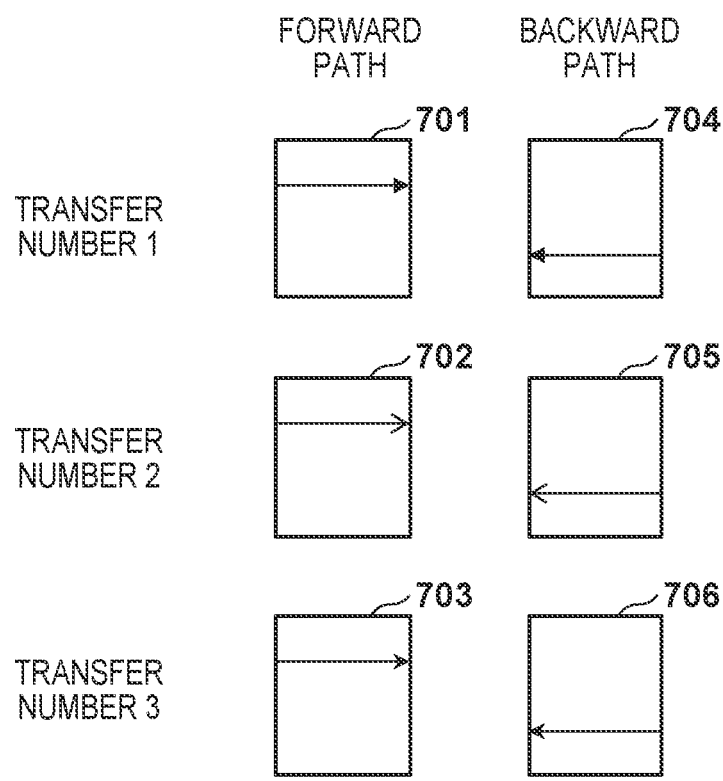
FIG. 16 is a table exemplarily showing the relationship between the imprint material supply order by the dispenser and the mold pattern transfer order by the imprint head.
FIG. 17 is a view for explaining a method of continuously arranging the imprint material by the dispenser with respect to a plurality of shot regions.

With reference to FIG. 16, the relationship between the imprint material supply order by the dispenser 106 and the transfer order of the pattern of the mold 102 by the imprint head 101 will be exemplarily described below. In the example shown in FIG. 16, the imprint material is continuously supplied by the dispenser 106 onto the shot regions having transfer numbers=1, 2, and 4. After that, the pattern of the mold 102 is continuously transferred by the imprint head 101 to each of the shot regions having transfer numbers 1 and 2. Thereafter, before transferring the pattern of the mold 102 to the shot region having transfer number 3, the imprint material is continuously supplied by the dispenser 106 onto the shot regions having transfer numbers 3 and 5.

When the imprint material is volatile, it is desirable that the pattern transfer step of the mold 102 is executed immediately after the imprint material supply step. Therefore, in the automatic assignment process described above, the controller 131 can be configured to execute automatic assignment such that the supply step is not executed for another group before the transfer process for the shot regions of one group is completed. The prohibiter 171 of the user interface 132 can be configured to set, as a constraint, that the supply step is not executed for another group before the transfer process for the shot regions of one group is completed, and prohibit the user from executing editing that does not satisfy this constraint.

Figure 20:
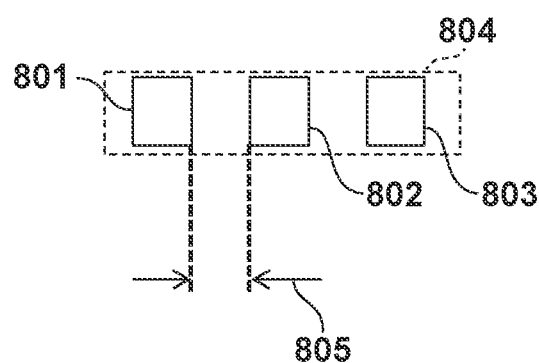
FIG. 20 is a view for explaining an application restricted distance.

The application restricted distance will be described below with reference to FIG. 20. An interval 805 between two shot regions 801 and 802 adjacent to each other in the scanning direction (X direction) of the substrate stage 104 in the imprint material supply step by the dispenser 106 need to be larger than a discharge port width 124 (FIG. 2) of the dispenser 106 in the scanning direction. Accordingly, the discharge port width 124 can be set as the application restricted distance. Therefore, the controller 131 can be configured to execute automatic assignment while setting the application restricted distance as a constraint in the automatic assignment process described above. The prohibiter 171 of the user interface 132 can be configured to set the application restricted distance as a constraint and prohibit the user from executing editing that does not satisfy the constraint.

FIGS. 22A to 22C show results of automatic assignment executed by the controller 131 in accordance with various constraints. Here, it is assumed that the application restricted distance is 1 mm, and the interval 805 between shot regions adjacent in the X direction is less than 1 mm. This means that shot regions adjacent in the X direction cannot be assigned to one group.

FIG. 22A shows an example in which the "transfer direction" constraint is set to X/Raster described above and the "transfer start position" constraint is set to the bottom and leftmost position. FIG. 22A exemplarily shows transfer number assignment 1001 and group assignment 1002 generated by the automatic assignment shown in FIG. 21 under these constraints. A number in the transfer number assignment 1001 indicates a transfer number, and a number in the group assignment 1002 indicates a group.

FIG. 22B shows an example in which the "transfer direction" constraint is set so as to switch between the +X direction and the −X direction for each row and the "transfer start position" constraint is set to the bottom and leftmost position. FIG. 22B exemplarily shows transfer number assignment 1003 and group assignment 1004 generated by the automatic assignment shown in FIG. 21 under these constraints. A number in the transfer number assignment 1003 indicates a transfer number, and a number in the group assignment 1004 indicates a group.

FIG. 22C shows an example in which the "transfer direction" constraint is set so as to perform raster scanning in the +Y direction and the "transfer start position" constraint is set to the bottom and leftmost position. FIG. 22C exemplarily shows transfer number assignment 1005 and group assignment 1006 generated by the automatic assignment shown in FIG. 21 under these constraints. A number in the transfer number assignment 1005 indicates a transfer number, and a number in the group assignment 1006 indicates a group.

Figure 23:
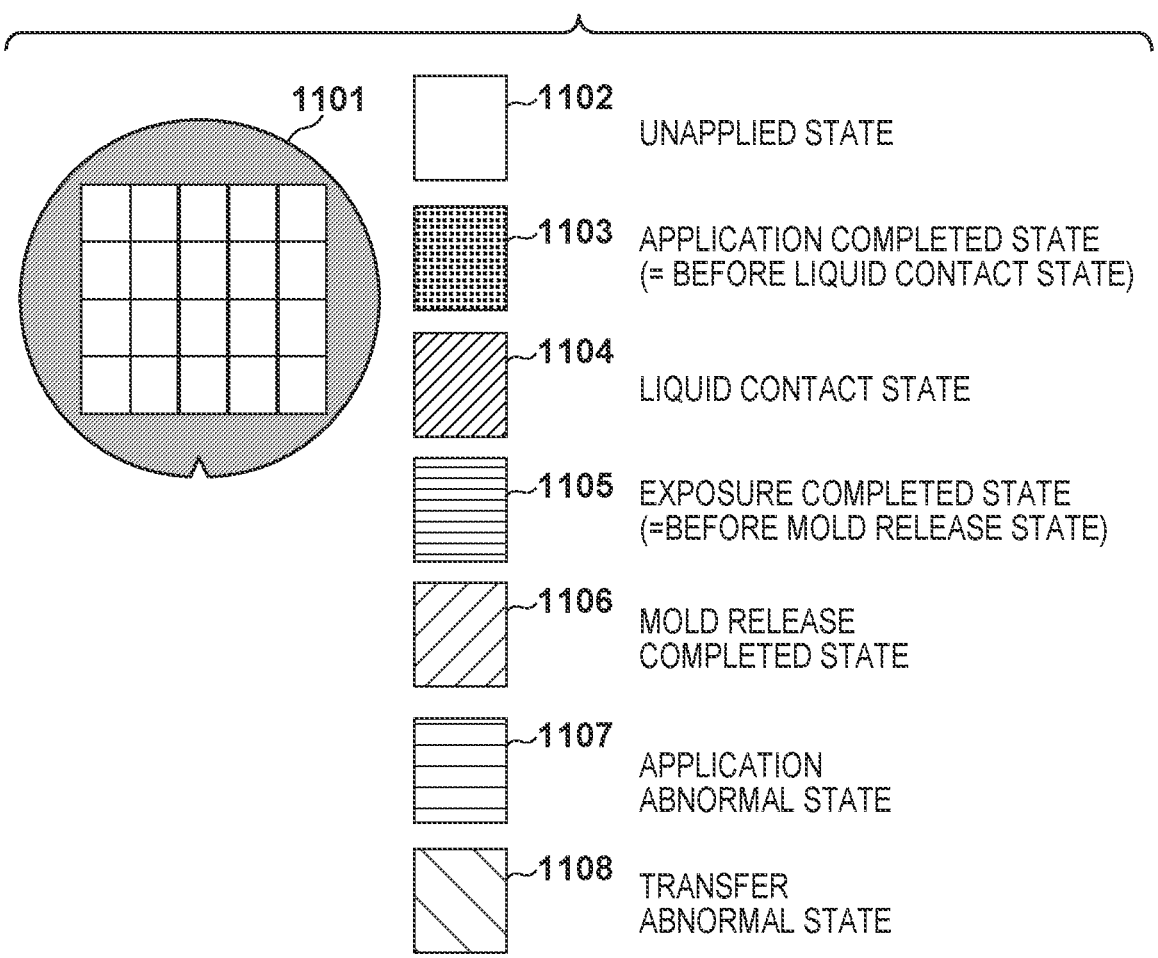
FIG. 23 is a view schematically showing the types of images each indicating the state of a process displayed on the display by the user interface during execution of an imprint process.
Figure 26E:
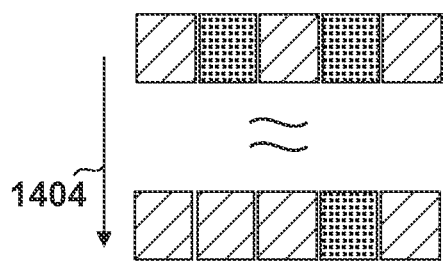
Figure 26F:
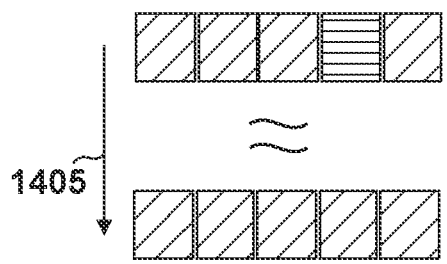

FIG. 23 exemplarily shows types of images each indicating the state of the process displayed on the display 152 by the user interface 132 during execution of an imprint process. The user interface 132 can display the image indicating the progress of an imprint process on the display 152. Such an image can include, for example, an image indicating that the imprint material has been arranged on the shot region, an image indicating that the imprint material is in contact with the mold, and an image indicating that the imprint material has been cured.

In the example shown in FIG. 23, the image includes images 1102 to 1108. A state display unit 1101 shows the state of each shot region using one of the images 1102 to 1108. The image 1102 indicates a state (unapplied state) in which the imprint material is not applied to the shot region. The image 1103 indicates a state (application completed state) after the imprint material has been applied to the shot region but before the mold 102 is in contact with the imprint material. The image 1104 indicates a state (liquid contact state) in which the imprint material in the shot region is in contact with the mold 102. The image 1105 indicates a state (exposure completed state) in which the imprint material in the shot region has been cured (exposed). The image 1106 indicates a state (mold release completed state) in which the mold 102 has been separated from the cured product of the imprint material in the shot region. The image 1107 indicates a state (application abnormal state) in which there is an imprint material application abnormality with respect to the shot region. The image 1108 indicates a state (transfer abnormal state) in which there is a transfer abnormality in the shot region. For each shot region, the user interface 132 changes the image so as to indicate the changed state every time the state changes.

FIGS. 24A to 24D exemplarily show images displayed on the display 152 by the user interface 132 during execution of the imprint process when each group is formed by one shot region. FIG. 24A exemplarily shows transfer number assignment and group number assignment. For example, the leftmost rectangle indicates a shot region having transfer number=1 and group number=1. The display on the display 152 transitions as transition orders 1201, 1202, and 1203 shown in FIGS. 24B to 24D, respectively.

FIGS. 25A to 25D exemplarily show images displayed on the display 152 by the user interface 132 during execution of the imprint process when an imprint material is applied onto the substrate by an external apparatus. The presentation method in FIGS. 25A to 25D follows that in FIGS. 24A to 24D. The display on the display 152 transitions as transition orders 1301, 1302, and 1303 shown in FIGS. 25B to 25D, respectively.

FIGS. 26A to 26F exemplarily show images displayed on the display 152 by the user interface 132 during execution of the imprint process when each group is formed by a plurality of shot regions. The presentation method in FIGS. 26A to 26F follows that in FIGS. 24A to 24D. In the example shown in FIGS. 26A to 26F, the shot regions having transfer numbers 1, 2, and 3 form a group having group number 1. The display 152 transitions as transition orders 1401, 1402, 1403, 1404, and 1405 shown in FIGS. 26B to 26F, respectively.

Figure 27:
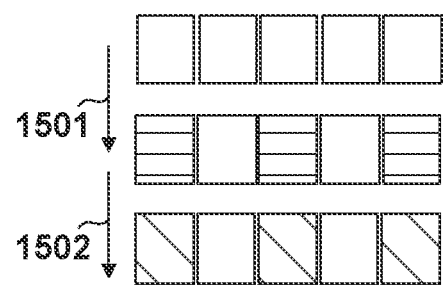
FIG. 27 is a view schematically showing images displayed on the display by the user interface during execution of the imprint process.

FIG. 27 exemplarily shows the transition of the display state when an application abnormality occurs during application of the imprint material in the example shown in FIGS. 26A to 26F. If an abnormality occurs during application of the imprint material to the shot region having group number=1, each of the rectangular images representing the shot regions having transfer numbers 1, 2, and 3 is changed to the image 1107 indicating that there is an application abnormality as shown in a display state transition order 1501. The transfer process is not executed on the shot regions having transfer numbers 1, 2, and 3, and the transfer step is stopped.

Thereafter, the user interface 132 prompts the user to determine whether to execute postprocessing on the shot regions having transfer numbers 1, 2, and 3 and continue the transfer sequence to the substrate 103 or unload the substrate 103. Here, the postprocessing is, for example, processing of curing an uncured imprint material without executing a transfer step and a mold release step. If it is selected to execute the postprocessing, each of the rectangular images representing the shot regions having transfer numbers 1, 2, and 3 is updated to the image 1108 indicating that there is a transfer abnormality as shown in a display state transition order 1502. Here, it may be set in advance whether to continue the transfer sequence to the substrate 103 or unload the substrate 103 when an application abnormality occurs, and the process may be continued based on the setting without stopping the transfer step.

Figure 28:
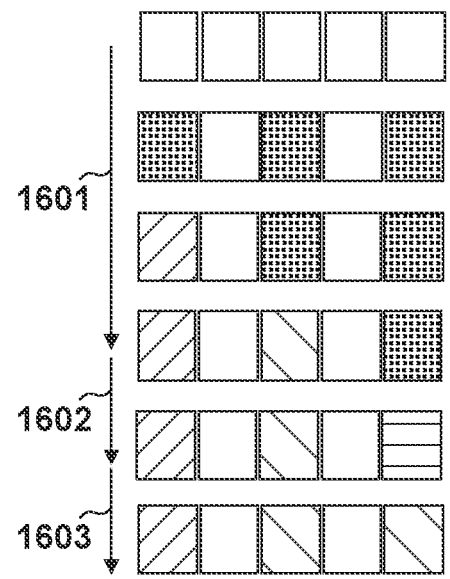
FIG. 28 is a view schematically showing images displayed on the display by the user interface during execution of the imprint process.
Figure 29D:
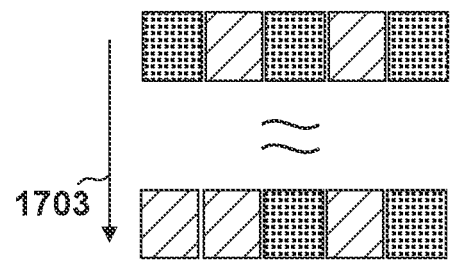
Figure 29E:
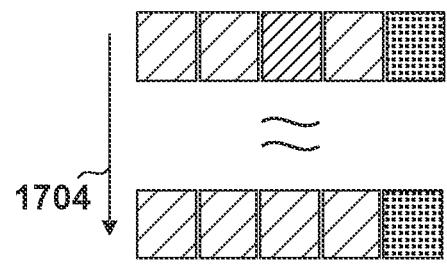
Figure 29F:
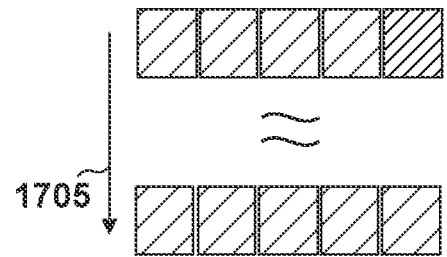

FIG. 28 exemplarily shows the transition of the display state when an abnormality occurs during the transfer step on the shot region having transfer number=2 in the example shown in FIGS. 26A to 26F. When an abnormality occurs during the transfer step on the shot region having transfer number=2, the rectangular image representing the shot region having transfer number=2 is changed to the image 1108 indicating that there is a transfer abnormality as shown in a display state transition order 1601. In addition, as shown in a display state transition order 1602, the rectangular image representing the shot region having transfer number=3 is changed to the image 1107 indicating that there is an application abnormality. The transfer process is not executed on the shot region having transfer number=3, and the transfer step is stopped.

Thereafter, the user interface 132 prompts the user to determine whether to execute postprocessing on the shot region having transfer number 3 and continue the transfer sequence to the substrate 103 or unload the substrate 103. If it is selected to execute postprocessing, the rectangular image representing the shot region having transfer number 3 is updated to the image 1108 indicating that there is a transfer abnormality as shown in a display state transition order 1603. Here, it may be set in advance whether to continue the transfer sequence to the substrate 103 or unload the substrate 103 when an application abnormality occurs, and the process may be continued based on the setting without stopping the transfer step.

In the description so far, the order in the transfer step (and supply step) is determined based on the transfer number, and the group number is simply used as a group identifier. In another embodiment, as exemplarily shown in FIGS. 29A to 29F, the processing order for a plurality of groups may be determined based on the group number, and the transfer order within each group may be determined based on the transfer number.

In this case, as shown in FIG. 29B, the imprint material supply step is first executed on the shot regions having transfer numbers=4 and 5 and group number=1, and then the transfer step is executed in the order of transfer numbers=4 and 5. Accordingly, as shown in a display state transition order 1701, each of the rectangular images representing the shot regions having transfer numbers 4 and 5 is changed to the image 1102 indicating the unapplied state and then to the image 1103 indicating the application completed state. Then, the rectangular image representing the shot region having transfer number=4 can be changed to the image 1104 indicating the liquid contact state, the image 1105 indicating the exposure completed state, and the image 1106 indicating the mold release completed state in the mentioned order. After that, as shown in a display state transition order 1702, the rectangular image representing the shot region having transfer number=5 can be changed to the image 1104 indicating the liquid contact state, the image 1105 indicating the exposure completed state, and the image 1106 indicating the mold release completed state in the mentioned order. The process on the shot regions having group number=1 is completed as shown in the display state transition orders 1701 and 1702, and the similar process is executed on the shot regions having transfer numbers=1 to 3 as shown in display state transition orders 1703 to 1705.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

An article manufacturing method in which an imprint apparatus forms a pattern on a substrate, processes the substrate on which the pattern is formed, and manufactures an article from the processed substrate will be described next.

Examples of the optical element include a microlens, a light guide, a waveguide, an antireflection film, a diffraction grating, a polarizing element, a color filter, a light emitting element, a display, and a solar cell. Examples of the MEMS include a DMD, a microchannel, and an electromechanical conversion element. Examples of the recording element include an optical disk such as a CD or a DVD, a magnetic disk, a magneto-optical disk, and a magnetic head. Examples of the sensor include a magnetic sensor, an optical sensor, and a gyro sensor.

Figure 30A:
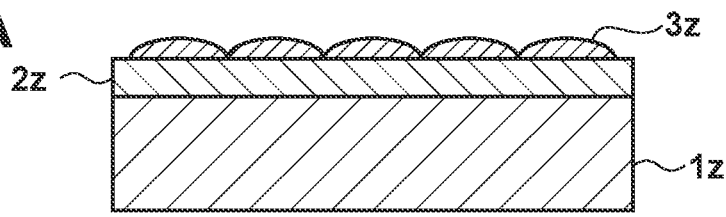
FIGS. 30A to 30F are views exemplarily showing an article manufacturing method.

An article manufacturing method in which an imprint apparatus forms a pattern on a substrate, processes the substrate on which the pattern is formed, and manufactures an article from the processed substrate will be described next. As shown FIG. 30A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 30B:
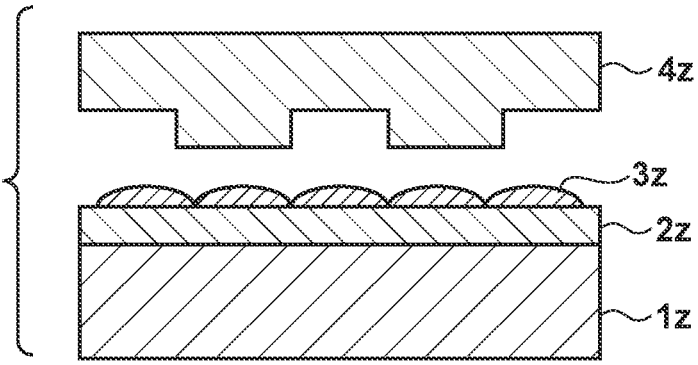
Figure 30C:
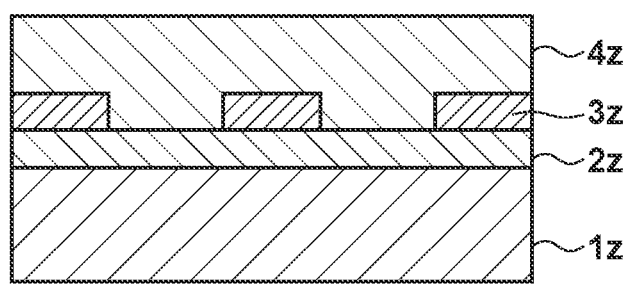

As shown in FIG. 30B, a side of a mold $4z$ for imprint with a concave-convex pattern is directed toward and made to face the imprint material $3z$ on the substrate. As shown FIG. 30C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with light as energy for curing via the mold $4z$, the imprint material $3z$ is cured.

Figure 30D:
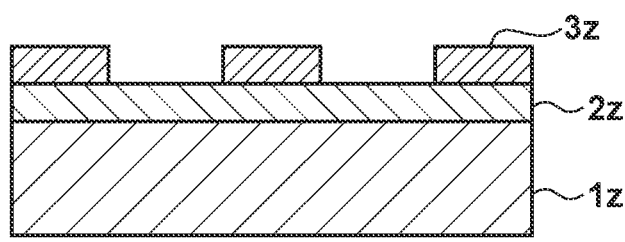

As shown in FIG. 30D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 30E:
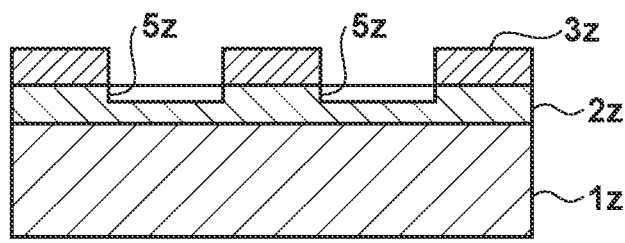
Figure 30F:
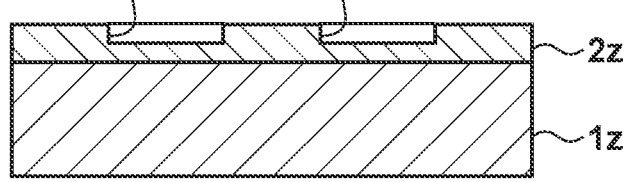

As shown in FIG. 30E, when etching is performed using the pattern of the cured product as an etching resistant mask, a portion of the surface of the processed material $2z$ where the cured product does not exist or remains thin is removed to form a groove $5z$. As shown in FIG. 30F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Figure 31A:
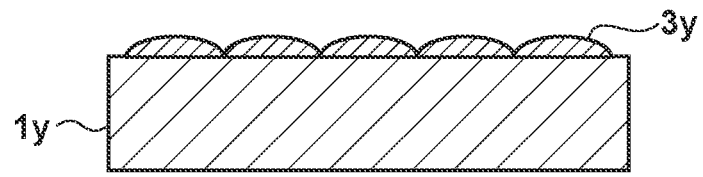
FIGS. 31A to 31D are views exemplarily showing another article manufacturing method.

Another article manufacturing method will be described next. As shown FIG. 31A, a substrate 1y such as silica glass is prepared. Next, an imprint material 3y is applied to the surface of the substrate 1y by an inkjet method or the like. A layer of another material such as a metal or a metal compound may be provided on the surface of the substrate 1y.

Figure 31B:
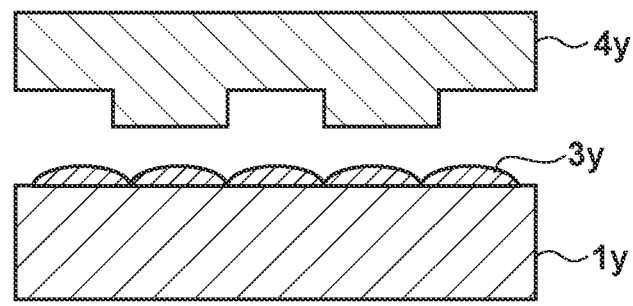
Figure 31C:
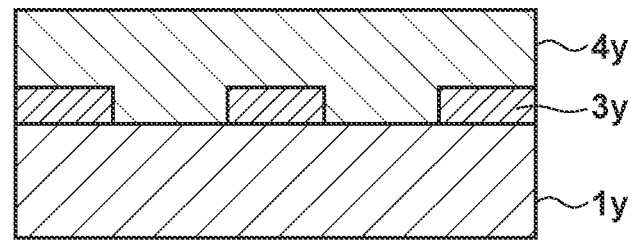

As shown in FIG. 31B, a side of a mold 4y for imprint with a concave-convex pattern is directed toward and made to face the imprint material 3y on the substrate. As shown FIG. 31C, the substrate 1y to which the imprint material 3y is applied is brought into contact with the mold 4y, and a pressure is applied. The gap between the mold 4y and the substrate 1y is filled with the imprint material 3y. In this state, when the imprint material 3y is irradiated with light via the mold 4y, the imprint material 3y is cured.

Figure 31D:
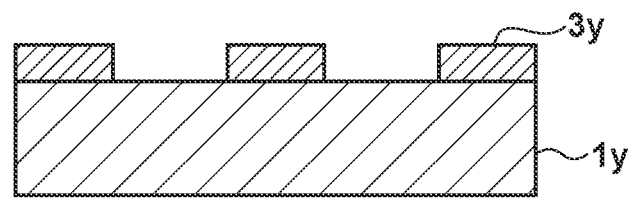

As shown in FIG. 31D, after the imprint material 3y is cured, the mold 4y is separated from the substrate 1y, and the pattern of the cured product of the imprint material 3y is formed on the substrate 1y. Thus, an article including the pattern of the cured product as a constituent member can be obtained. Note that when the substrate 1y is etched using the pattern of the cured product as a mask in the state shown in FIG. 31D, an article with the concave and convex portions reversed with respect to the mold 4y, for example, an imprint mold can be obtained.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-021824, filed Feb. 8, 2019, which is hereby incorporated by reference herein in its entirety.

What is claimed is:

1. An imprint apparatus that performs an imprint process of bringing a mold into contact with an imprint material on a substrate and curing the imprint material, the apparatus comprising:
    a controller configured to assign each of a plurality of shot regions of the substrate to any one of a plurality of groups; and
    a user interface configured to display information about the plurality of groups to which the plurality of shot regions have been assigned, and having an editing field for changing a group to which a shot region selected from the plurality of shot regions has been assigned,
    wherein the user interface has a field for setting an upper limit number of shot regions belonging to one group,
    wherein, in a case that the upper limit number is one, an imprint material is supplied, by a dispenser, onto one shot region which has been assigned to the one group, and then the imprint process is performed for the one shot region, and
    wherein, in a case that the upper limit number is at least two, an imprint material is supplied, by the dispenser, onto at least two of shot regions which have been assigned to the one group, and then the imprint process is performed for the at least two of shot regions.

2. The apparatus according to claim 1, wherein the user interface includes a prohibiter configured to prohibit editing that does not satisfy a preset constraint.

3. The apparatus according to claim 2, wherein the preset constraint includes a constraint on an interval between shot regions to be satisfied by shot regions belonging to the one group.

4. The apparatus according to claim 2, wherein the user interface allows a user to perform editing for assigning an order of forming a pattern made of an imprint material to each of the plurality of shot regions.

5. The apparatus according to claim 4, wherein the preset constraint includes a constraint on an arranging direction of the shot regions onto which an imprint material is to be supplied from the dispenser.

6. The apparatus according to claim 4, wherein the preset constraint includes a constraint which prohibits that, before the pattern made of the imprint material is formed in each of all shot regions forming a group, a pattern made of an imprint material in each of shot regions of another group is formed.

7. The apparatus according to claim 2, wherein the user interface comprises a display controller configured to display, in response to a user selecting an editing target, a candidate that satisfies the preset constraint with respect to the editing target.

8. The apparatus according to claim 1, wherein the user interface allows a user to perform editing for assigning an order of forming a pattern made of an imprint material to each of the plurality of shot regions.

9. The apparatus according to claim 1, wherein the user interface comprises a display controller configured to display an error that occurs when editing that does not satisfy a preset constraint has been performed.

10. The apparatus according to claim 1, wherein the controller is further configured to control a process of forming a pattern made of an imprint material on each of the plurality of shot regions of the substrate in accordance with a result of editing performed using the user interface.

11. The apparatus according to claim 10, wherein the controller removes a shot region in which a total supply amount of the imprint material is set to 0 from a group to which the shot region belongs.

12. The apparatus according to claim 10, wherein the shot region in which a total supply amount of the imprint material is set to 0 is supplied with an imprint material by an external apparatus, and
the controller controls the process such that for the shot region in which the total supply amount of the imprint material is set to 0, a pattern made of an imprint material is formed on the shot region without supplying an imprint material onto the shot region by the dispenser.

13. The apparatus according to claim 10, wherein the controller controls the process such that for a shot region in which a total supply amount of the imprint material is set to 0, a pattern made of an imprint material is formed on the shot region without supplying an imprint material onto the shot region by the dispenser only if pattern formation on the shot region is permitted, and
the shot region in which the total supply amount of the imprint material is set to 0 indicates that an imprint material is supplied by an external apparatus.

14. The apparatus according to claim 1, wherein the user interface displays, on a display, an image indicating progress of a process in each shot region.

15. The apparatus according to claim 14, wherein the image includes an image indicating that the imprint material has been arranged on the shot region, an image indicating that the imprint material is in contact with the mold, and an image indicating that the imprint material has been cured.

16. The apparatus according to claim 2, wherein the preset constraint includes a constraint on the upper limit number of shot regions belonging to the one group.

17. An article manufacturing method comprising:
forming a pattern on a substrate using an imprint apparatus; and manufacturing the article by processing the substrate on which the pattern has been formed in the forming,
wherein the imprint apparatus performs an imprint process of bringing a mold into contact with an imprint material on the substrate and curing the imprint material, and comprises:
a controller configured to assign each of a plurality of shot regions of the substrate to any one of a plurality of groups, and
a user interface configured to display information about the plurality of groups to which the plurality of shot regions have been assigned, and having an editing field for changing a group to which a shot region selected from the plurality of shot regions has been assigned,
wherein the user interface has a field for setting an upper limit number of shot regions belonging to one group,
wherein, in a case that the upper limit number is one, an imprint material is supplied, by a dispenser, onto one shot region which has been assigned to the one group, and then the imprint process is performed for the one shot region,
wherein, in case that the upper limit number is at least two, an imprint material is supplied, by the dispenser, onto at least two of shot regions which have been assigned to the one group, and then the imprint process is performed for the at least two of shot regions.

18. A control method of an imprint apparatus that performs an imprint process of bringing a mold into contact with an imprint material on a substrate and curing the imprint material, the method comprising:
assigning each of a plurality of shot regions of the substrate to any one of a plurality of groups;
displaying, on a user interface, information about the plurality of groups to which the plurality of shot regions have been assigned; and
changing a group to which a shot region selected from the plurality of shot regions has been assigned, in accordance with an instruction given from a user through the user interface,
wherein the user interface has a field for setting an upper limit number of shot regions belonging to one group,
wherein, in a case that the upper limit number is one, an imprint material is supplied, by a dispenser, onto one shot region which has been assigned to the one group, and then the imprint process is performed for the one shot region,
wherein, in case that the upper limit number is at least two, an imprint material is supplied, by the dispenser, onto at least two of shot regions which have been assigned to the one group, and then the imprint process is performed for the at least two of shot regions.

19. A non-transitory computer readable medium storing a program that controls an imprint apparatus that performs an imprint process of bringing a mold into contact with an imprint material on a substrate and curing the imprint material, the program causing a computer to perform:
assigning each of a plurality of shot regions of the substrate to any one of a plurality of groups;
displaying, on a user interface, information about the plurality of groups to which the plurality of shot regions have been assigned; and
changing a group to which a shot region selected from the plurality of shot regions has been assigned, in accordance with an instruction given from a user through the user interface,
wherein the user interface has a field for setting an upper limit number of shot regions belonging to one group,
wherein, in a case that the upper limit number is one, an imprint material is supplied, by a dispenser, onto one shot region which has been assigned to the one group, and then the imprint process is performed for the one shot region,
wherein, in case that the upper limit number is at least two, an imprint material is supplied, by the dispenser, onto at least two of shot regions which have been assigned to the one group, and then the imprint process is performed for the at least two of shot regions.

* * * * *